(12) United States Patent
Li et al.

(10) Patent No.: US 12,068,356 B2
(45) Date of Patent: Aug. 20, 2024

(54) LIGHT-EMITTING DEVICE WITH INSULATING LAYER BETWEEN ELECTRODES ON DIFFERENT LAYERS

(71) Applicant: SAMSUNG DISPLAY CO., LTD., Yongin-si (KR)

(72) Inventors: Xinxing Li, Yongin-si (KR); Tae Jin Kong, Yongin-si (KR); Hee Keun Lee, Yongin-si (KR); Dae Hyun Kim, Yongin-si (KR); Hyun Min Cho, Yongin-si (KR); Chang Il Tae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 617 days.

(21) Appl. No.: 17/284,319

(22) PCT Filed: Apr. 10, 2019

(86) PCT No.: PCT/KR2019/004292
§ 371 (c)(1),
(2) Date: Apr. 9, 2021

(87) PCT Pub. No.: WO2020/075935
PCT Pub. Date: Apr. 16, 2020

(65) Prior Publication Data
US 2021/0391380 A1 Dec. 16, 2021

(30) Foreign Application Priority Data
Oct. 11, 2018 (KR) .................. 10-2018-0121409

(51) Int. Cl.
*H01L 27/15* (2006.01)
*H01L 33/24* (2010.01)
(Continued)

(52) U.S. Cl.
CPC ............ *H01L 27/156* (2013.01); *H01L 33/24* (2013.01); *H01L 33/38* (2013.01); *H01L 33/44* (2013.01); *H01L 2933/0016* (2013.01)

(58) Field of Classification Search
CPC ....... H01L 27/156; H01L 33/24; H01L 33/38; H01L 2933/0016; H01L 25/0753;
(Continued)

(56) References Cited

U.S. PATENT DOCUMENTS 8,872,214 B2 10/2014 Negishi et al.
9,229,236 B2 1/2016 Hino et al.
(Continued)

FOREIGN PATENT DOCUMENTS

JP 2005-136142 5/2005
JP 4814394 11/2011
(Continued)

OTHER PUBLICATIONS

International Search Report, with English translation, corresponding to International Application No. PCT/KR2019/004292 dated Jul. 18, 2019.
(Continued)

*Primary Examiner* — Lex H Malsawma
*Assistant Examiner* — Laura M Dykes
(74) *Attorney, Agent, or Firm* — KILE PARK REED & HOUTTEMAN PLLC

(57) ABSTRACT

A light emitting device may include a first electrode disposed on a substrate; a first insulating layer disposed on the substrate and overlapping at least a part of the first electrode; a second electrode disposed on the first insulating layer and spaced apart from the first electrode; and at least one light emitting diode electrically connected between the first electrode and the second electrode. The first electrode and the second electrode may be disposed on different layers on the
(Continued)

substrate, the first insulating layer is disposed between the first electrode and the second electrode, and the first electrode and the second electrode are spaced apart from each other so as not to overlap each other in a plan view.

18 Claims, 26 Drawing Sheets

(51) Int. Cl.
*H01L 33/38* (2010.01)
*H01L 33/44* (2010.01)

(58) Field of Classification Search
CPC ............... H01L 33/486; H01L 25/167; H01L 2933/0066; H01L 33/62; H01L 33/36; H01L 33/483
USPC .......................................................... 257/89
See application file for complete search history.

(56) References Cited

U.S. PATENT DOCUMENTS

| | | | |
|---|---|---|---|
| 9,287,242 B2 | 3/2016 | Shibata et al. | |
| 9,443,904 B1 | 9/2016 | Chen et al. | |
| 9,570,425 B2 | 2/2017 | Do | |
| 9,773,761 B2 | 9/2017 | Do | |
| 9,911,764 B2 | 3/2018 | Bae et al. | |
| 10,340,419 B2 | 7/2019 | Kim et al. | |
| 10,410,577 B2 | 9/2019 | Lai et al. | |
| 10,461,123 B2 | 10/2019 | Kim et al. | |
| 2003/0160258 A1* | 8/2003 | Oohata ............... H01S 5/32325 257/E33.059 |
| 2011/0089850 A1 | 4/2011 | Shibata et al. | |
| 2015/0084054 A1* | 3/2015 | Fan .................... H01L 25/0753 257/72 |
| 2015/0333221 A1* | 11/2015 | Bibl .................... H01L 21/6835 438/34 |
| 2018/0095571 A1 | 4/2018 | Park et al. | |
| 2018/0122836 A1 | 5/2018 | Kang et al. | |
| 2018/0175009 A1* | 6/2018 | Kim ........................ H01L 33/20 |
| 2018/0175106 A1 | 6/2018 | Kim et al. | |
| 2018/0197899 A1 | 7/2018 | Bae et al. | |
| 2018/0198018 A1 | 7/2018 | Kim et al. | |
| 2019/0244985 A1* | 8/2019 | Kim ........................ H01L 27/124 |

FOREIGN PATENT DOCUMENTS

| | | |
|---|---|---|
| JP | 4914929 | 4/2012 |
| KR | 10-2012-0001288 | 1/2012 |
| KR | 10-1163646 | 7/2012 |
| KR | 10-2014-0085331 | 7/2014 |
| KR | 10-1436123 | 11/2014 |
| KR | 10-1490758 | 2/2015 |
| KR | 10-2016-0087265 | 7/2016 |
| KR | 10-2017-0026956 | 3/2017 |
| KR | 10-2018-0009014 | 1/2018 |
| KR | 10-2018-0072909 | 7/2018 |
| KR | 10-1974086 | 5/2019 |
| KR | 10-2020-0041430 | 4/2020 |

OTHER PUBLICATIONS

Written Opinion, with English translation, corresponding to International Application No. PCT/KR2019/004292, dated Jul. 18, 2019.

* cited by examiner

LIGHT-EMITTING DEVICE WITH INSULATING LAYER BETWEEN ELECTRODES ON DIFFERENT LAYERS

CROSS-REFERENCE TO RELATED APPLICATION(S)

This application is a national entry of International Application No. PCT/KR2019/004292, filed on Apr. 10, 2019, which claims under 35 U. S. C. §§ 119(a) and 365(b) priority to and benefits of Korean Patent Application No. 10-2018-0121409, filed on Oct. 11, 2018 in the Korean Intellectual Property Office (KIPO), the entire contents of which are incorporated herein by reference.

BACKGROUND

1. Technical Field

Various embodiments of the disclosure relate to a light emitting device, a method of fabricating the light emitting device, and a display device having the light emitting device.

2. Description of Related Art

Recently, technologies of manufacturing a subminiature light emitting diode using a material having a reliable inorganic crystal structure and manufacturing a light emitting device using the light emitting diode have been developed. For example, the technologies of manufacturing subminiature light emitting diodes having a small size in a range from the nanoscale to the microscale, and forming a light source of a light emitting device using the subminiature light emitting diodes have been developed. Such a light emitting device may be provided in various electronic devices such as a display device and a lighting device.

SUMMARY

Various embodiments of the disclosure relate to a light emitting device including a light emitting diode, a method of fabricating the light emitting device, and a display device including the light emitting device.

According to an aspect of the disclosure, a light emitting device may include a first electrode disposed on a substrate; a first insulating layer disposed on the substrate and overlapping at least a part of the first electrode; a second electrode disposed on the first insulating layer and spaced apart from the first electrode; and at least one light emitting diode electrically connected between the first electrode and the second electrode. The first electrode and the second electrode may be disposed on different layers on the substrate, the first insulating layer may be disposed between the first electrode and the second electrode, and the first electrode and the second electrode may be spaced apart from each other so as not to overlap each other in a plan view.

In an embodiment, the light emitting device may further include a first partition wall disposed between the substrate and the first electrode; and a second partition wall disposed between the substrate and the second electrode.

In an embodiment, the first partition wall and the second partition wall may be disposed on a same layer on the substrate. A part of the first insulating layer may be disposed between the second partition wall and the second electrode.

In an embodiment, the light emitting device may further include a display element layer including the first electrode, the second electrode, and the at least one light emitting diode, and a circuit element layer disposed between the display element layer and the substrate. The circuit element layer may include a first circuit element or a first power line electrically connected to the first electrode and including a part overlapping the second electrode; and a second circuit element or a second power line electrically connected to the second electrode and including a part overlapping the first electrode.

In an embodiment, an overlapping surface area between the first circuit element or the first power line and the second electrode may be greater than an overlapping surface area between the second circuit element or the second power line and the first electrode.

In an embodiment, the light emitting device may further include a first contact electrode disposed on at least a part of the first electrode and a first end of the at least one light emitting diode, and electrically connecting the first end of the at least one light emitting diode to the first electrode; and a second contact electrode disposed on at least a part of the second electrode and a second end of the at least one light emitting diode, and electrically connecting the second end of the at least one light emitting diode to the second electrode.

In an embodiment, the first insulating layer may include an opening in which a part of the first electrode is exposed. The first contact electrode may electrically contact the exposed part of the first electrode and the first end of the at least one light emitting diode.

In an embodiment, the light emitting device may further include a second insulating layer disposed on the second contact electrode and overlapping the second contact electrode. An end of the second insulating layer may be disposed between the first contact electrode and the second contact electrode.

In an embodiment, the light emitting device may further include a third insulating layer disposed on a part of the second electrode.

In an embodiment, the light emitting device may further include at least one of a fourth insulating layer disposed on the first electrode, the second electrode, and a part of the at least one light emitting diode; and a fifth insulating layer overlapping the first contact electrode, the fifth insulating layer including an end disposed between the first contact electrode and the second contact electrode.

In an embodiment, the light emitting device may further include a sixth insulating layer disposed on a part of the first electrode, a part of the second electrode, and a part of the at least one light emitting diode, and exposing a part of the first electrode, and a part of the second electrode, and the first end and the second end of the at least one light emitting diode.

In an embodiment, an end of the first contact electrode may be disposed on a part of the sixth insulating layer that is disposed on the at least one light emitting diode. An end of the second contact electrode may be disposed on a part of the sixth insulating layer that is disposed on the at least one light emitting diode and face the first contact electrode.

In an embodiment, the light emitting device may further include at least one encapsulation layer overlapping a surface of the substrate on which the first contact electrode and the second contact electrode are disposed.

In an embodiment, the at least one light emitting diode may include a rod-type light emitting diode oriented in a horizontal direction between the first electrode and the second electrode.

According to an aspect of the disclosure, a method of fabricating a light emitting device may include forming a first electrode on a substrate; forming a first insulating layer on the substrate to overlap at least the first electrode; forming a second electrode on the first insulating layer at a position spaced apart from the first electrode; supplying a light emitting diode onto the substrate, and aligning the light emitting diode between the first electrode and the second electrode; and forming a first contact electrode electrically connecting a first end of the light emitting diode to the first electrode, and forming a second contact electrode electrically connecting a second end of the light emitting diode to the second electrode.

In an embodiment, the forming of the first contact electrode may include forming a first contact portion by etching the first insulating layer such that a part of the first electrode is exposed; and forming the first contact electrode on at least a part of the first electrode including the first contact portion and on the first end of the light emitting diode.

In an embodiment, the forming of the second contact electrode may include forming the second contact electrode on at least a part of the second electrode and the second end of the light emitting diode.

In an embodiment, the first contact electrode and the second contact electrode may be sequentially formed on the substrate, or the first contact electrode and the second contact electrode are simultaneously formed on the substrate.

In an embodiment, the method may further include, after the forming of the second electrode, forming a third insulating layer to overlap the second electrode. The light emitting diode may be supplied onto the substrate on which the third insulating layer is formed.

According to an aspect of the disclosure, a display device may include a substrate including a display area; and a pixel disposed in the display area. The pixel may include a first electrode disposed on the substrate; a first insulating layer disposed on the substrate and overlapping at least a part of the first electrode; a second electrode disposed on the first insulating layer, and spaced apart from the first electrode in a plan view; and at least one light emitting diode electrically connected between the first electrode and the second electrode.

In a light emitting device, a method of fabricating the light emitting device, and a display device including the light emitting device in accordance with embodiments of the disclosure, a short-circuit defect between first and second electrodes may be prevented. Furthermore, light emitting diodes may be stably arranged between the first electrode and the second electrode.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
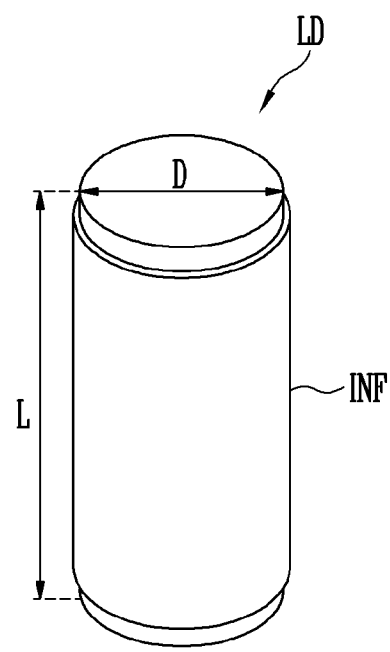
FIGS. 1A and 1B are respectively a perspective view and a cross-sectional view schematically illustrating a light emitting diode in accordance with an embodiment of the disclosure.

Reference will now be made in detail to various embodiments of the disclosure, specific examples of which are illustrated in the accompanying drawings and described below, and the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanations may be omitted.

It will be understood that, although the terms "first," "second," and the like may be used herein to describe various elements, these elements should not be limited by these terms. It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the term "position," "direction," or the like used in the following description are defined in relative terms, and it should be noted that they may be changed into a reverse position or direction depending on a view angle or direction.

Embodiments and required details of the disclosure are described with reference to the accompanying drawings in order to describe the disclosure in detail so that those having ordinary knowledge in the technical field to which the disclosure pertains can readily practice the disclosure. Furthermore, a singular form may include a plural form as long as it is not specifically mentioned in a sentence.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

FIGS. 1A, 1B, 2A, 2B, 3A, and 3B are schematic perspective diagrams and schematic cross-sectional diagrams illustrating light emitting diodes LD in accordance with embodiments. Although FIGS. 1A to 3B illustrate cylindrical rod-type light emitting diodes LD, the type and/or shape of the light emitting diode LD in accordance with the disclosure is not limited thereto.

Figure 1B:
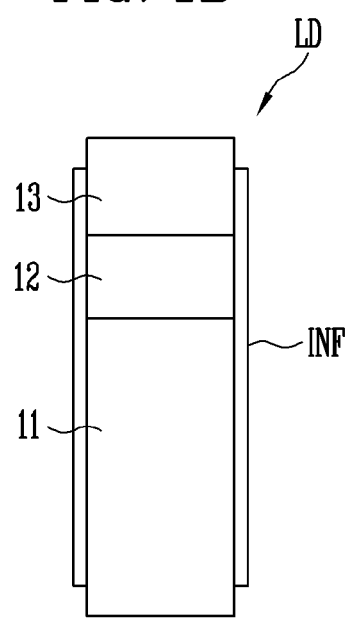

Referring to FIGS. 1A and 1B, a light emitting diode LD in accordance with an embodiment may include a first conductivity type semiconductor layer 11 (also referred to as a "first semiconductor layer"), a second conductivity type semiconductor layer 13 (also referred to as a "second semiconductor layer"), and an active layer 12 interposed between the first and second conductivity type semiconductor layers 11 and 13. For example, the light emitting diode LD may be configured of or formed of a stacked body formed by successively stacking the first conductivity type semiconductor layer 11, the active layer 12, and the second conductivity type semiconductor layer 13.

In an embodiment, the light emitting diode LD may be provided in the form of a rod extending in a direction. If the direction in which the light emitting diode LD extends is defined as a longitudinal direction, the light emitting diode LD may have a first end and a second end in the longitudinal direction.

In an embodiment, one of the first and second conductivity type semiconductor layers 11 and 13 may be disposed on the first end of the light emitting diode LD, and the other of the first and second conductivity type semiconductor layers 11 and 13 may be disposed on the second end of the light emitting diode LD.

In an embodiment, the light emitting diode LD may be a rod-type light emitting diode manufactured in the form of a rod. In this specification, the term "rod-type shape" may mean a rod-like shape and a bar-like shape such as a cylindrical shape and a prismatic shape extending in a longitudinal direction (for example, having an aspect ratio greater than 1), and the cross-sectional shape thereof is not limited to a particular shape. For example, a length L of the light emitting diode LD may be greater than a diameter D thereof (or a width of the cross-section thereof).

In an embodiment, the light emitting diode LD may have a small size corresponding to a nanoscale size or a microscale size, e.g., a diameter D and/or a length L corresponding to a microscale to nanoscale. However, in the disclosure, the size of the light emitting diode LD is not limited thereto. For example, the size of the light emitting diode LD may be changed in various ways depending on design conditions of various devices, e.g., display devices, which employ, as a light source, a light emitting device using a light emitting diode LD.

The first conductivity type semiconductor layer 11 may include, for example, at least one n-type semiconductor layer. For instance, the first conductivity type semiconductor layer 11 may include an n-type semiconductor layer which includes any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited thereto, and the first conductivity type semiconductor layer 11 may be formed of various other materials.

The active layer 12 may be disposed on the first conductivity type semiconductor layer 11 and have a single or multiple quantum well structure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a predetermined voltage or greater is applied to the opposite ends of the light emitting diode LD, the light emitting diode LD may emit light by recombination of electron-hole pairs in the active layer 12. Since light emission of the light emitting diode LD can be controlled based on the foregoing principle, the light emitting diode LD may be used as a light source of various light emitting devices as well as a pixel of a display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes any one semiconductor material of InAlGaN, GaN, AlGaN, InGaN, AlN, and InN and is doped with a second conductive dopant such as Mg. However, the material forming the second conductivity type semiconductor layer 13 is not limited thereto, and the second conductivity type semiconductor layer 13 may be formed of various other materials.

In an embodiment, the light emitting diode LD may further include an insulating film INF provided on the surface of the light emitting diode LD. In an embodiment, the insulating film INF may be formed on the surface of the light emitting diode LD to enclose at least an outer circumferential surface of the active layer 12. The insulating film INF may further enclose an area of each of the first and second conductivity type semiconductor layers 11 and 13. Here, the insulating film INF may allow the opposite ends of the light emitting diode LD that have different polarities to be exposed to the outside. For example, the insulating film INF may expose an end of each of the first and second conductivity type semiconductor layers 11 and 13 that are disposed on the respective opposite ends of the light emitting diode LD in the longitudinal direction, and, for example, may expose two base sides (the top and bottom surfaces) of the cylinder rather than covering the two base sides.

In an embodiment, the insulating film INF may include at least one insulating material of $SiO_2$, $Si_3N_4$, $Al_2O_3$, and $TiO_2$ but is not limited thereto. In other words, the material that forms the insulating film INF is not limited to a particular material, and the insulating film INF may be formed of known various insulating materials.

In an embodiment, the light emitting diode LD may further include additional components as well as the first conductivity type semiconductor layer 11, the active layer 12, the second conductivity type semiconductor layer 13, and/or the insulating film INF. For example, the light emitting diode LD may further include at least one fluorescent layer, at least one active layer, at least one semiconductor layer and/or at least one electrode layer disposed on one end of the first conductivity type semiconductor layer 11, the active layer 12, and/or the second conductivity type semiconductor layer 13.

Figure 2A:
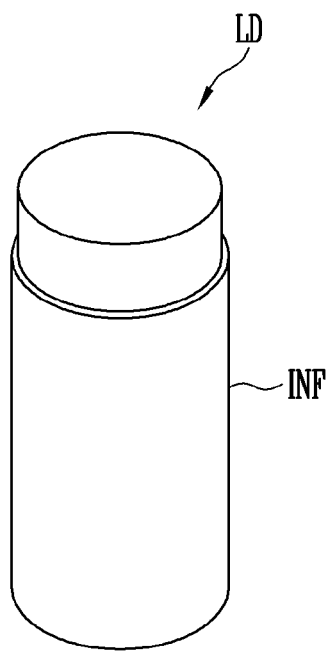
FIGS. 2A and 2B are respectively a perspective view and a cross-sectional view schematically illustrating a light emitting diode in accordance with an embodiment of the disclosure.
Figure 2B:
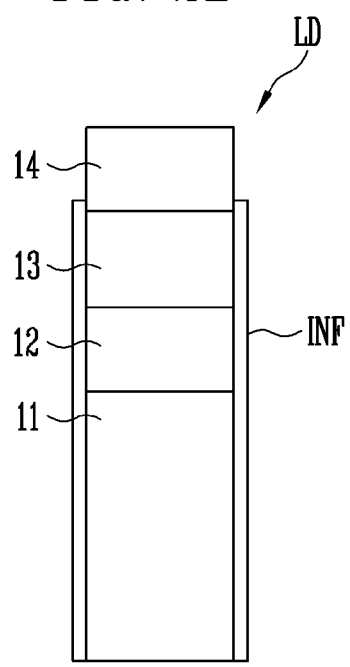
Figure 3A:
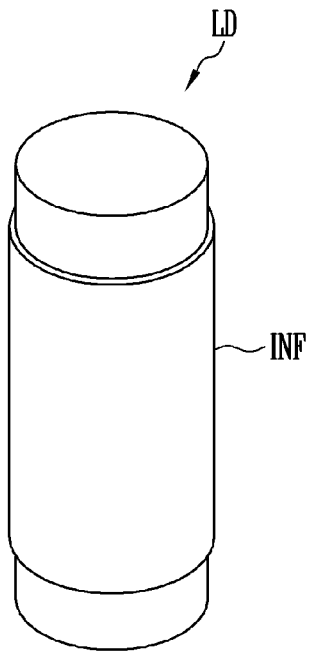
FIGS. 3A and 3B are respectively a perspective view and a cross-sectional view schematically illustrating a light emitting diode in accordance with an embodiment of the disclosure.
Figure 3B:
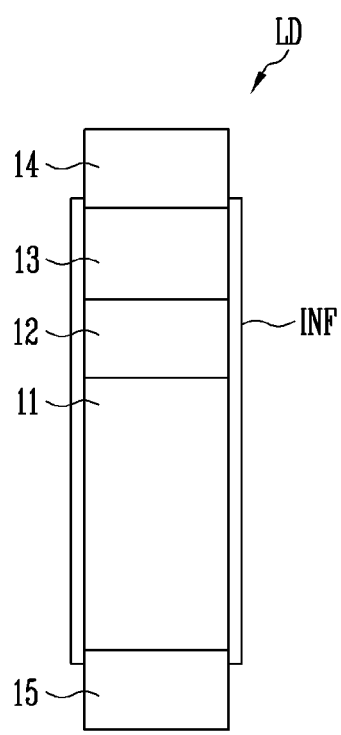

For example, as shown in FIGS. 2A and 2B, the light emitting diode LD may further include at least one electrode layer 14 disposed on an end of the second conductivity type semiconductor layer 13. In an embodiment, as shown in FIGS. 3A and 3B, the light emitting diode LD may further include at least one electrode layer 15 disposed on an end of the first conductivity type semiconductor layer 11.

Each of the electrode layers 14 and 15 may be an ohmic contact electrode but is not limited thereto. Each of the electrode layers 14 and 15 may include metal or a metal oxide. For example, Cr, Ti, Al, Au, Ni, ITO, IZO, ITZO, and an oxide or alloy thereof may be used alone or in combination with each other. In an embodiment, the electrode layers 14 and 15 may be substantially transparent or translucent. Therefore, light generated from the light emitting diode LD may be emitted out of the light emitting diode LD after passing through the electrode layers 14 and 15.

In an embodiment, the insulating film INF may at least partially enclose or may not enclose the outer circumferential surfaces of the electrode layers 14 and 15. In other words, the insulating film INF may be selectively formed on the surfaces of the electrode layers 14 and 15. Furthermore, the insulating film INF may be formed to allow the opposite ends of the light emitting diode LD having different polarities to be exposed and, for example, may allow at least one area of each of the electrode layers 14 and 15 to be exposed. As another example, in an embodiment, the insulating film INF may not be provided.

If the insulating film INF is provided on the surface of the light emitting diode LD, particularly, on the surface of the active layer 12, the active layer 12 may be prevented from short-circuiting with at least one electrode (e.g., at least one of contact electrodes connected to the opposite ends of the light emitting diode LD), which is not illustrated. Therefore, the electrical stability of the light emitting diode LD may be secured.

Furthermore, thanks to the insulating film INF formed on the surface of the light emitting diode LD, occurrence of a defect on the surface of the light emitting diode LD may be reduced or minimized, and thus the lifetime and efficiency of the light emitting diode LD may be improved. If the insulating film INF is formed on each light emitting diode LD, in case that light emitting diodes LD are disposed adjacent to each other, the light emitting diodes LD may be prevented from undesirably short-circuiting.

In an embodiment of the disclosure, the light emitting diode LD may be fabricated through a surface treatment process. For example, the light emitting diode LD may be surface-treated (e.g., by a coating process) so that, in case that light emitting diodes LD are mixed with a fluidic solution and then are supplied to each light emitting area (e.g., a light emitting area of each pixel), the light emitting diodes LD can be evenly distributed rather than unevenly aggregating in the solution.

The above-described light emitting diode LD may be used in various devices including a display device which requires a light source. For instance, at least one subminiature light emitting diode LD, e.g., multiple subminiature light emitting diodes LD each having a size ranging from the nanoscale to the microscale, may be disposed in each pixel area of a display panel so as to form a light source (or a light source unit) of the corresponding pixel. Furthermore, the field of application of the light emitting diode LD according to the disclosure is not limited to a display device. For example, the light emitting diode LD may also be used in various devices such as a lighting device which requires a light source.

Figure 4:
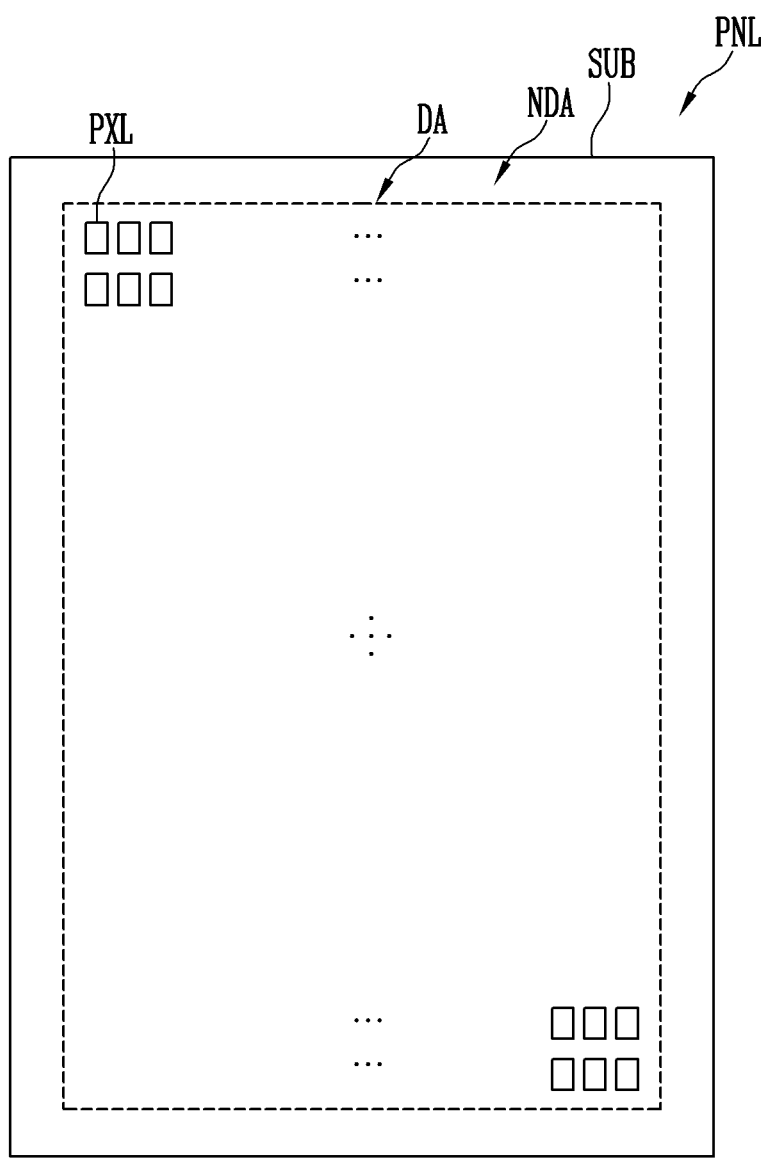
FIG. 4 is a plan view schematically illustrating a display device in accordance with an embodiment of the disclosure.

FIG. 4 is a schematic plan view illustrating a display device in accordance with an embodiment. In an embodiment, FIG. 4 illustrates a display device, particularly, a display panel PNL provided in the display device, as an example of a device in which the light emitting diode LD described with reference to FIGS. 1A to 3B may be used as a light source. For example, pixels PXL of the display panel PNL each may include a light emitting device. The light emitting device may include at least one light emitting diode LD.

For the sake of explanation, FIG. 4 schematically illustrates a structure of the display panel PNL in accordance with an embodiment, focusing on a display area DA. In some embodiments, although not illustrated, at least one driving circuit (e.g., at least one of a scan driver and a data driver) and/or lines may be further provided on the display panel PNL.

Referring to FIG. 4, the display panel PNL in accordance with an embodiment may include a substrate SUB and pixels PXL disposed on the substrate SUB. In detail, the display panel PNL and the substrate SUB for forming the display panel PNL may include a display area DA for displaying an image and a non-display area NDA formed in a predetermined area other than the display area DA. The pixels PXL may be disposed in the display area DA on the substrate SUB.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited thereto, and the locations thereof may be changed.

The substrate SUB may form a base of the display panel PNL. In an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate but is not limited thereto. For instance, the substrate SUB may be a translucent substrate, an opaque substrate, or a reflective substrate.

An area of the substrate SUB may be defined as the display area DA in which the pixels PXL are disposed, and the other area thereof may be defined as the non-display area NDA. For example, the substrate SUB may include the display area DA including pixel areas in which the respective pixels PXL are formed, and the non-display area NDA disposed around or adjacent to the display area DA. Various lines and/or internal circuits electrically connected to the pixels PXL of the display area DA may be disposed in the non-display area NDA.

In an embodiment, the pixels PXL may be distributed and arranged in the display area DA. In an embodiment, the pixels PXL may be arranged in a stripe shape in the display area DA. However, the disclosure is not limited thereto. For example, the pixels PXL may be arranged in various well-known shapes in the display area DA.

Each pixel PXL may include at least one light source, which is driven by a predetermined control signal (e.g., a scan signal and a data signal) and/or power (e.g., first and second power) and may include, for example, a light emitting diode LD according to any one of the embodiments of FIGS. 1A to 3B. For example, each pixel PXL may include at least one light emitting diode LD having a small size ranging from the nanoscale to the microscale. For example, each pixel PXL may include rod-type light emitting diodes which are connected in parallel between pixel electrodes and/or power lines. The rod-type light emitting diodes may form a light emitting device of each pixel PXL (e.g., a light source or a light source unit of each pixel PXL).

In an embodiment, each pixel PXL may be formed of an active pixel. However, the types, structures, and/or driving schemes of the pixels PXL capable of being applied to the display device according to the disclosure are not particularly limited. For example, each pixel PXL and a pixel of various known passive or active light emitting display devices may have the same structure.

Figure 5A:
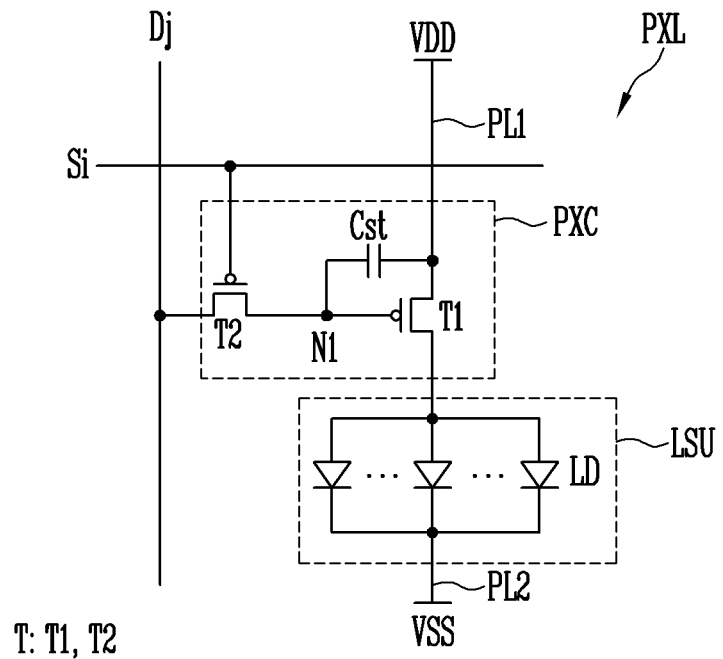
FIGS. 5A to 5C each are a circuit diagram schematically illustrating a light emitting device in accordance with an embodiment of the disclosure and for example illustrate different embodiments of an active pixel PXL including the light emitting device.
Figure 5B:
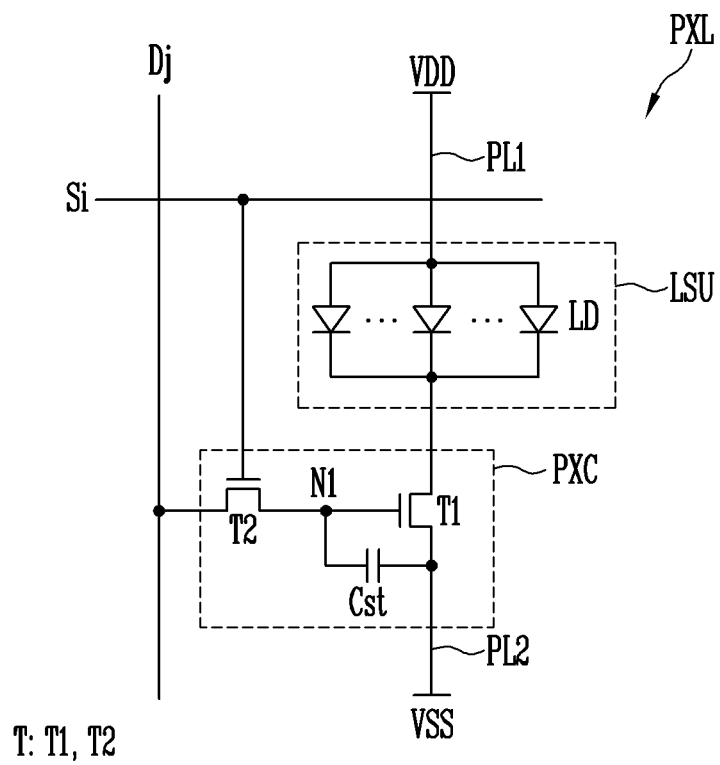
Figure 5C:
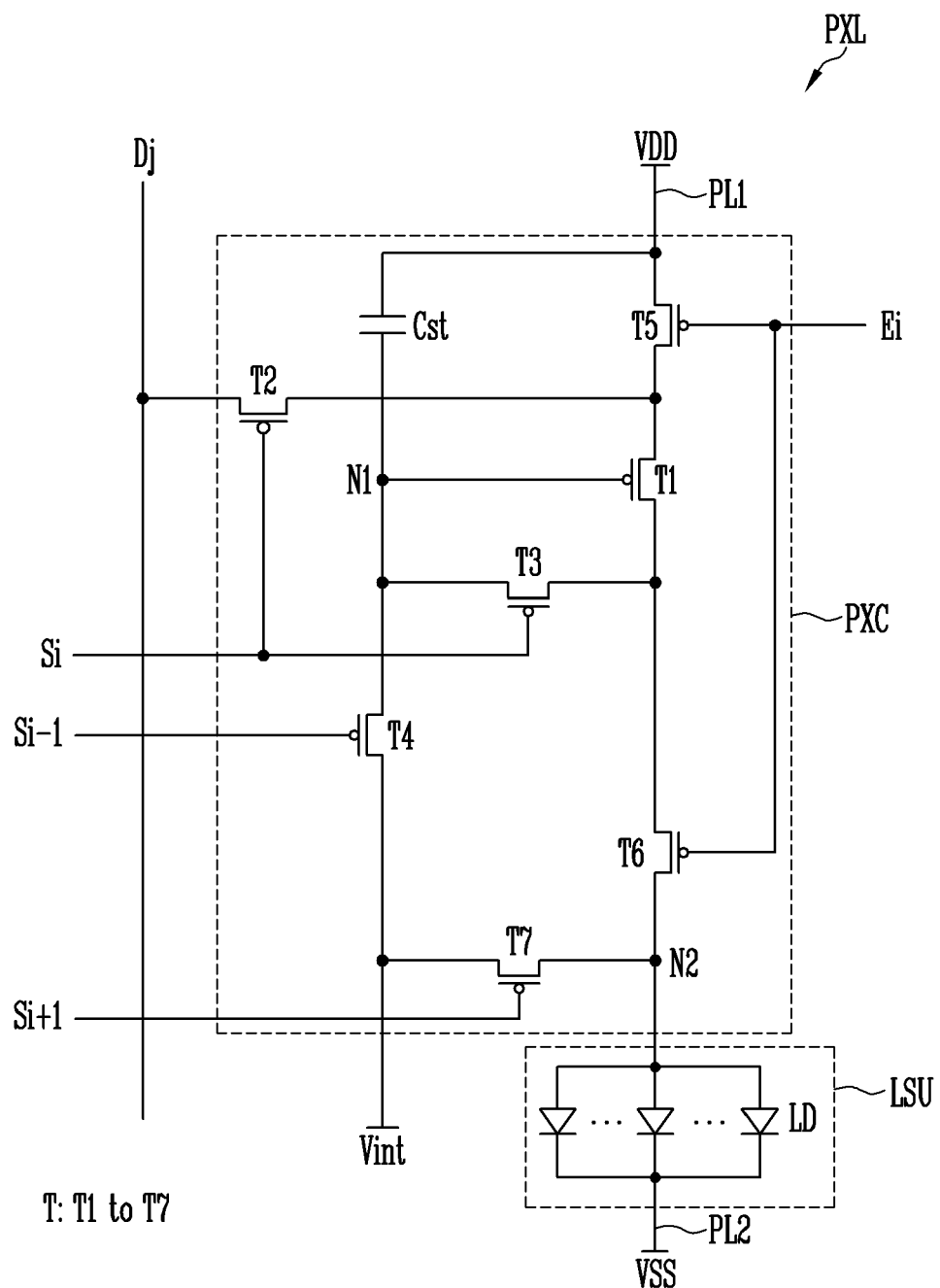

FIGS. 5A to 5C each are a circuit diagram schematically illustrating a light emitting device in accordance with an embodiment, and for example illustrate different embodiments of an active pixel PXL including the light emitting device. In an embodiment, each pixel PXL illustrated in FIGS. 5A to 5C may be any one of the pixels PXL provided on the display panel PNL of FIG. 4. The pixels PXL may have substantially the same or similar structure.

Referring to FIG. 5A, the pixel PXL in accordance with an embodiment may include a light source unit LSU configured to generate light having a luminance corresponding to a data signal, and a pixel circuit PXC configured to drive the light source unit LSU. The light source unit LSU may form a light emitting device in accordance with an embodiment.

In an embodiment, the light source unit LSU may include light emitting diodes LD connected in parallel to each other between a first power supply VDD and a second power supply VSS. Here, the first and second power supplies VDD and VSS may have different potentials so that the light emitting diodes LD may emit light. For example, the first power supply VDD may be set as a high-potential power supply, and the second power supply VSS may be set as a low-potential power supply. Here, a difference in potential between the first and second power supplies VDD and VSS may be set to a voltage equal to or greater than a threshold voltage of the light emitting diodes LD during at least a light emitting period of the pixel PXL.

Although FIG. 5A schematically illustrates an embodiment in which the light emitting diodes LD forming the light source unit LSU of each pixel PXL are connected in parallel to each other in the same direction (e.g., a forward direction) between the first power supply VDD and the second power supply VSS, the disclosure is not limited thereto. For example, in an embodiment, some of the light emitting diodes LD may be connected to each other in a first direction (e.g., the forward direction) between the first and second power supplies VDD and VSS, and the other light emitting diodes LD may be connected to each other in a second direction (e.g., a reverse direction). As another example, in an embodiment, at least one pixel PXL may include only a single light emitting diode LD.

In an embodiment, first ends of the light emitting diodes LD forming each light source unit LSU may be electrically connected in common to a corresponding pixel circuit PXC through a first electrode of the light source unit LSU and may be electrically connected to the first power supply VDD through the pixel circuit PXC and a first power line PL1. Second ends of the light emitting diodes LD may be electrically connected in common to the second power supply VSS through a second electrode of the light source unit LSU and a second power line PL2.

Each light source unit LSU may emit light having a luminance corresponding to driving current supplied thereto through the corresponding pixel circuit PXC. Therefore, a predetermined image may be displayed in the display area DA.

The pixel circuit PXC may be electrically connected to a scan line Si (for example, an i-th scan line) and a data line Dj of the corresponding pixel PXL. For example, if the pixel PXL is disposed in an i-th row (where i is a natural number) and a j-th column (where j is a natural number) of the display area DA, the pixel circuit PXC of the pixel PXL may be electrically connected to an i-th scan line Si and a j-th data line Dj of the display area DA. The pixel circuit PXC may include first and second transistors T1 and T2, and a storage capacitor Cst.

The first transistor T1 (driving transistor) may be connected between the first power supply VDD and the first electrode of the light source unit LSU. A gate electrode of the first transistor T1 may be electrically connected to a first node N1. The first transistor T1 may control driving current to be supplied to the light source unit LSU in response to a voltage of the first node N1.

The second transistor T2 (switching transistor) may be connected between the data line Dj and the first node N1. A gate electrode of the second transistor T2 may be electrically connected to the scan line Si.

In case that a scan signal of a gate-on voltage (e.g., a low voltage) is supplied from the scan line Si, the second transistor T2 may be turned on to electrically connect the first node N1 to the data line Dj. During each frame period, a data signal of a corresponding frame may be supplied to the data line Dj. The data signal may be transmitted to the first node N1 via the second transistor T2. Therefore, the storage capacitor Cst may be charged with a voltage corresponding to the data signal.

An electrode of the storage capacitor Cst may be electrically connected to the first power supply VDD, and the other electrode thereof may be electrically connected to the first node N1. The storage capacitor Cst may store a voltage corresponding to a data signal supplied to the first node N1 during each frame period and may maintain the stored voltage until a data signal of a subsequent frame is supplied thereto.

Although in FIG. 5A, the transistors, e.g., the first and second transistors T1 and T2, included in the pixel circuit PXC have been illustrated as being P-type transistors, the disclosure is not limited thereto. In other words, the first transistor T1 and/or second transistor T2 may be changed to an N-type transistor.

For example, as shown in FIG. 5B, both the first and second transistors T1 and T2 may be N-type transistors. The configuration and operation of the pixel PXL illustrated in FIG. 5B may be substantially similar to those of the pixel PXL of FIG. 5A, except that connection positions of some circuit elements are changed as well as changes in types of the transistors. Therefore, detailed descriptions of the pixel PXL of FIG. 5B will be omitted.

The structure of the pixel circuit PXC is not limited to the embodiments shown in FIGS. 5A and 5B. In other words, the pixel circuit PXC may be formed of a well-known pixel circuit which may have various structures and/or be operated by various driving schemes. For example, the pixel circuit PXC and the pixel PXL of FIG. 5C may be configured in the same manner.

Referring to FIG. 5C, the pixel circuit PXC may be electrically connected to a scan line Si of a corresponding horizontal line and to at least another scan line (or a control line). For example, the pixel circuit PXC of the pixel PXL disposed in the i-th row of the display area DA may be further electrically connected to an i−1-th scan line Si−1 and/or an i+1-th scan line Si+1. In an embodiment, the pixel circuit PXC may be electrically connected not only to the first and second power supplies VDD and VSS but also to other power supplies. For instance, the pixel circuit PXC may also be electrically connected to an initialization power supply Vint. In an embodiment, the pixel circuit PXC may include first to seventh transistors T1 to T7 and a storage capacitor Cst.

The first transistor T1 may be connected between the first power supply VDD and the first electrode of the light source unit LSU. A gate electrode of the first transistor T1 may be electrically connected to a first node N1. The first transistor T1 may control driving current to be supplied to the light source unit LSU in response to a voltage of the first node N1.

The second transistor T2 may be connected between the data line Dj and an electrode of the first transistor T1. A gate electrode of the second transistor T2 may be electrically connected to the corresponding scan line Si. In case that a scan signal of a gate-on voltage is supplied from the scan line Si, the second transistor T2 may be turned on to electrically connect the data line Dj to the electrode of the first transistor T1. Therefore, if the second transistor T2 is turned on, a data signal supplied from the data line Dj may be transmitted to the first transistor T1.

The third transistor T3 may be connected between the other electrode of the first transistor T1 and the first node N1. A gate electrode of the third transistor T3 may be electrically connected to the corresponding scan line Si. In case that a scan signal of a gate-on voltage is supplied from the scan line Si, the third transistor T3 may be turned on to electrically connect the first transistor T1 in the form of a diode. In other words, the first transistor T1 may be diode-connected.

The fourth transistor T4 may be connected between the first node N1 and the initialization power supply Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be connected between the first power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal of a gate-off voltage (e.g., a high voltage) is supplied to the emission control line Ei and may be turned on in other cases.

The sixth transistor T6 may be connected between the first transistor T1 and a second node N2, which is electrically connected to the first electrode of the light source unit LSU. A gate electrode of the sixth transistor T6 may be electrically connected to a corresponding emission control line, e.g., the i-th emission control line Ei. The sixth transistor T6 may be turned off in case that an emission control signal of a gate-off voltage is supplied to the emission control line Ei and may be turned on in other cases.

The seventh transistor T7 may be connected between the second node N2, which is electrically connected to the first electrode of the light source unit LSU, and the initialization power supply Vint. A gate electrode of the seventh transistor T7 may be electrically connected to any one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding to the data signal applied to the first node N1 during each frame period and/or to the threshold voltage of the first transistor T1.

Although FIG. 5C illustrates the transistors, e.g., the first to seventh transistors T1 to T7, included in the pixel circuit PXC as being P-type transistors, the disclosure is not limited thereto. For example, at least one of the first to seventh transistors T1 to T7 may be changed to an N-type transistor.

The structure of the pixel PXL which may be applied to the disclosure is not limited to the embodiments illustrated in FIGS. 5A to 5C, and each pixel PXL may have various known structures. For example, the pixel circuit PXC included in each pixel PXL may be formed of a known pixel circuit which may have various structures and/or be operated by various driving schemes. In an embodiment, each pixel PXL may be configured in a passive light emitting display device or the like. In this case, the pixel circuit PXC may be omitted, and each of the first and second electrodes of the light source unit LSU may be directly connected to the scan line Si, the data line Dj, a power line, and/or the control line.

Figure 6:
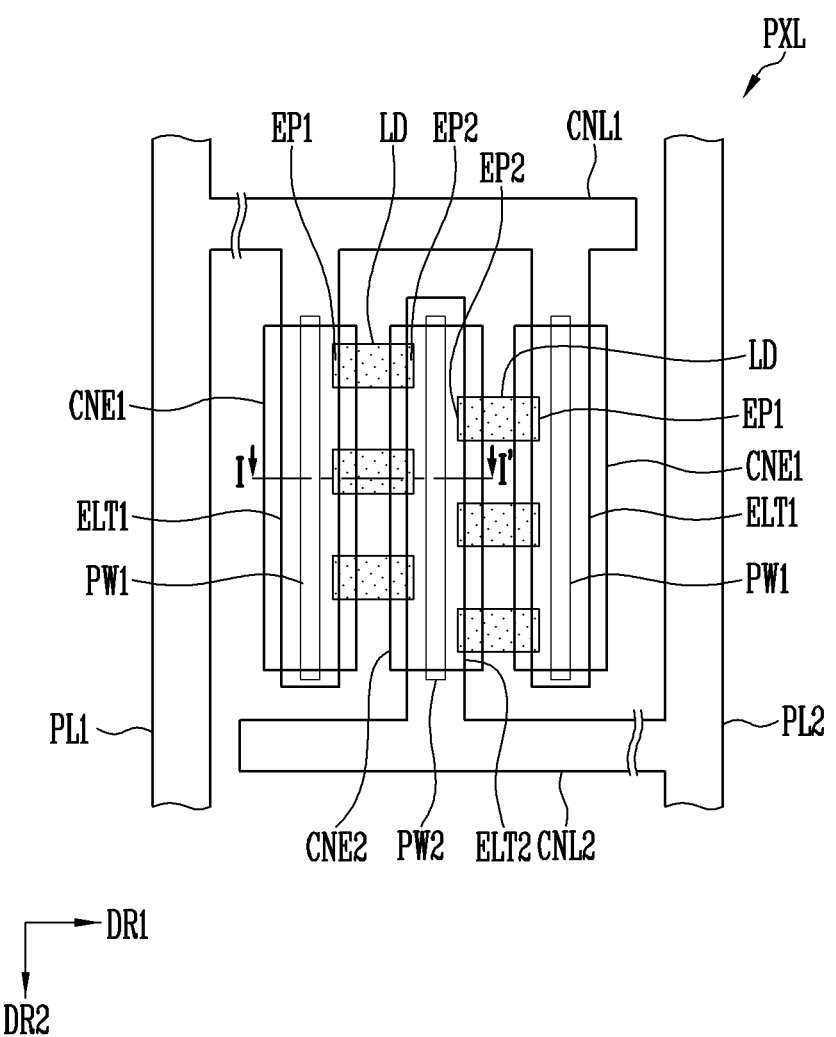
FIG. 6 is a plan view schematically illustrating a light emitting device in accordance with an embodiment of the disclosure and for example illustrates an example of a pixel formed of the light emitting device.

FIG. 6 is a schematic plan view illustrating a light emitting device in accordance with an embodiment and, for example, illustrates an example of a pixel PXL including the light emitting device. In an embodiment, FIG. 6 illustrates a light emitting device (e.g., a pixel PXL of a passive light emitting display device) which includes first and second power lines PL1 and PL2 (or signal lines such as scan lines and data lines) or is directly connected to the first and second power lines PL1 and PL2. However, the light emitting device according to the disclosure is not limited to the embodiment illustrated in FIG. 6. For example, in an embodiment of the disclosure, the light emitting device may be connected to the first and/or second power line PL1 and/or PL2 via at least one circuit element (e.g., the pixel circuit PXC of FIGS. 5A to 5C), a connection line, a signal line, or the like.

Referring to FIG. 6, the pixel PXL in accordance with an embodiment may include a first electrode ELT1 and a second electrode ELT2 spaced apart from each other, at least one light emitting diode LD disposed between the first and second electrodes ELT1 and ELT2, e.g., light emitting diodes LD arranged in parallel to each other, and first and second contact electrodes CNE1 and CNE2 which electrically connect (or couple) the light emitting diodes LD between the first and second electrodes ELT1 and ELT2. The pixel PXL may further include a first connection electrode CNL1 which electrically connects the first electrode ELT1 to the first power line PL1, and a second connection electrode CNL2 which electrically connects the second electrode ELT2 to the second power line PL2. In an embodiment, the first and second connection electrodes CNL1 and CNL2 may be respectively integral with the first and second electrodes ELT1 and ELT2, or electrically connected (or coupled) to the first and second electrodes ELT1 and ELT2 via at least one contact hole or the like. In case that the first and second connection electrodes CNL1 and CNL2 are respectively integral with the first and second electrodes ELT1 and ELT2, each of the first and second connection electrodes CNL1 and CNL2 may be regarded as an area of a corresponding electrode of the first and second electrodes ELT1 and ELT2. The pixel PXL may further include a first partition wall PW1 (also referred to as a "first wall", "first bank" or "first pattern") which overlaps the first electrode ELT1 and a second partition wall PW2 (also referred to as a "second wall", "second bank" or "second pattern") which overlaps the second electrode ELT2.

In an embodiment, the first and second partition walls PW1 and PW2, the first and second electrodes ELT1 and ELT2, the light emitting diodes LD, and/or the first and second contact electrodes CNE1 and CNE2 may form a light emitting device in accordance with an embodiment. For example, the first and second partition walls PW1 and PW2, the first and second electrodes ELT1 and ELT2, the light emitting diodes LD, and/or the first and second contact electrodes CNE1 and CNE2 may form a light source unit (e.g., the LSU of FIGS. 5A to 5C) of the pixel PXL in accordance with an embodiment.

The first electrode ELT1 and the second electrode ELT2 may be spaced apart from each other and disposed such that at least portions thereof face each other. For example, the first and second electrodes ELT1 and ELT2 may be disposed in parallel to each other at positions spaced apart from each other by a predetermined distance on a surface of a substrate provided to form the base of the pixel PXL (or the light emitting device). For example, in a predetermined emission area, the first and second electrodes ELT1 and ELT2 may be spaced apart from each other by a predetermined distance in the first direction DR1 and each may extend in the second direction DR2 intersecting the first direction DR1. However, the disclosure is not limited thereto. For example, the shapes and/or the mutual disposition relationship of the first and second electrodes ELT1 and ELT2 may be changed in various ways.

In an embodiment, each of the first and second electrodes ELT1 and ELT2 may have a single-layer or multi-layer structure. For example, each first electrode ELT1 may have a multi-layer structure including a first reflective electrode and a first conductive capping layer. Each second electrode ELT2 may have a multi-layer structure including a second reflective electrode and a second conductive capping layer.

In an embodiment, the first electrode ELT1 may be electrically connected to the first power line PL1 through the first connection electrode CNL1. In an embodiment, the first electrode ELT1 and the first connection electrode CNL1 may extend in different directions. For example, in case that the first connection electrode CNL1 extends in the first direction DR1 (e.g., in a horizontal direction), the first electrode ELT1 may extend in the second direction DR2 (e.g., in a vertical direction) intersecting the first direction DR1.

In an embodiment, the first electrode ELT1 may be integral with the first connection electrode CNL1. For instance, the first electrode ELT1 may diverge in at least one way from the first connection electrode CNL1. However, the disclosure is not limited thereto. For example, in an embodiment, the first electrode ELT1 and the first connection electrode CNL1 may be individually formed and electrically connected to each other through at least one contact hole, at least one via hole, or the like.

In an embodiment, the first electrode ELT1 and/or the first connection electrode CNL1 may be integral with the first power line PL1. In an embodiment, the first electrode ELT1 and/or the first connection electrode CNL1 may be formed separately from the first power line PL1 and electrically connected to the first power line PL1 via at least one contact hole and/or at least one circuit element. Therefore, first power to be supplied to the first power line PL1 may be transmitted to the first electrode ELT1.

In an embodiment, the second electrode ELT2 may be connected to the second power line PL2 through the second connection electrode CNL2. In an embodiment, the second electrode ELT2 and the second connection electrode CNL2 may extend in different directions. For example, in case that the second connection electrode CNL2 extends in the first direction DR1, the second electrode ELT2 may extend in the second direction DR2 intersecting the first direction DR1.

In an embodiment, the second electrode ELT2 may be integral with the second connection electrode CNL2. For instance, the second electrode ELT2 may diverge in at least one way from the second connection electrode CNL2. However, the disclosure is not limited thereto. For example, in an embodiment, the second electrode ELT2 and the second connection electrode CNL2 may be separately formed and electrically connected to each other through at least one contact hole, at least one via hole, or the like.

In an embodiment, the second electrode ELT2 and/or the second connection electrode CNL2 may be integral with the second power line PL2. In an embodiment, the second electrode ELT2 and/or the second connection electrode CNL2 may be formed individually from the second power line PL2 and electrically connected to the second power line PL2 via at least one contact hole and/or at least one circuit element. Therefore, second power to be supplied to the second power line PL2 may be transmitted to the second electrode ELT2.

In an embodiment, the first power supply (e.g., the first power supply VDD of FIGS. 5A to 5C) and the second power supply (e.g., the second power supply VSS of FIGS. 5A to 5C) may have different potentials. For example, a difference in potential between the first power supply VDD and the second power supply VSS may be equal to or greater than a threshold voltage of the light emitting diodes LD. In an embodiment, the first power supply VDD and the second power supply VSS may have potentials enabling at least one light emitting diode LD to be connected between the first and second electrodes ELT1 and ELT2 in a forward direction. In other words, the voltage between the first power supply VDD and the second power supply VSS may have a value enabling at least one light emitting diode LD included in the pixel PXL (or the light emitting device) to emit light.

In an embodiment, the first partition wall PW1 may be disposed under the first electrode ELT1 such that the first partition wall PW1 overlaps an area of the first electrode ELT1. The second partition wall PW2 may be disposed under the second electrode ELT2 such that the second partition wall PW2 overlaps an area of the second electrode ELT2. The first and second partition walls PW1 and PW2 may be disposed in a predetermined emission area at positions spaced apart from each other and may respectively make areas of the first and second electrode ELT1 and ELT2 protrude upward. For example, the first electrode ELT1 may be disposed on the first partition wall PW1 and protrude in a height direction by the first partition wall PW1. The second electrode ELT2 may be disposed on the second partition wall PW2 and protrude in the height direction by the second partition wall PW2.

In an embodiment, the light emitting diodes LD may be connected in parallel with each other between the first electrode ELT1 and the second electrode ELT2. For example, each light emitting diode LD may be a rod-type light emitting diode which is arranged between the first and second electrodes ELT1 and ELT2 in the first direction DR1, e.g., in the horizontal direction, in an area in which the first electrode ELT1 and the second electrode ELT2 are disposed to face each other.

Although FIG. 6 illustrates that the light emitting diodes LD are uniformly arranged in a direction, e.g., the first direction DR1, the disclosure is not limited thereto. For example, at least one of the light emitting diodes LD may be arranged between the first and second electrodes ELT1 and ELT2 in a diagonal direction.

In an embodiment, each light emitting diode LD may be a light emitting diode which is made of material having an inorganic crystal structure and has, for example, a subminiature size ranging, e.g., from the nanoscale to the microscale. For example, each light emitting diode LD may be a subminiature rod-type light emitting diode which has a diameter D and/or a length L ranging from the nanoscale to the microscale, as illustrated in FIGS. 1A to 3B. However, the size of the light emitting diode LD may be changed in various ways depending on design conditions or the like of each light emitting device, e.g., the pixel PXL.

In an embodiment, first ends EP1 of the light emitting diodes LD may be electrically connected to the first electrode ELT1 via the first contact electrode CNE1. Second ends EP2 of the light emitting diodes LD may be electrically connected to the second electrode ELT2 via the second contact electrode CNE2. In an embodiment, at least one of the first and second ends EP1 and EP2 of each light emitting diode LD may directly contact the first and/or second electrodes ELT1 and/or ELT2 and be electrically connected to the first and/or second electrodes ELT1 and/or ELT2.

In an embodiment, the light emitting diodes LD may be prepared in a diffused form in a predetermined solution, and then supplied by an inkjet printing scheme or the like to a predetermined emission area (e.g., the emission area of each pixel PXL) defined in the light emitting device. For example, the light emitting diodes LD may be mixed with a volatile solvent and supplied to each emission area. Here, if the voltage of the first power supply VDD and the second power supply VS S are respectively applied to the first and second electrodes ELT1 and ELT2 through the first and second power lines PL1 and PL2, an electric field may be formed between the first and second electrodes ELT1 and ELT2, whereby the light emitting diodes LD are aligned between the first and second electrodes ELT1 and ELT2. After the light emitting diodes LD have been aligned, the solvent may be removed by a volatilization method or other methods. In this way, the light emitting diodes LD may be reliably arranged between the first and second electrodes ELT1 and ELT2. Furthermore, the first contact electrode CNE1 and the second contact electrode CNE2 may be respectively formed on the opposite ends, i.e., the first and second ends EP1 and EP2, of the light emitting diodes LD. Therefore, the light emitting diodes LD may be more reliably connected between the first and second electrodes ELT1 and ELT2.

In an embodiment, the first contact electrode CNE1 may overlap both the first ends EP1 of the light emitting diodes LD and at least one area of the first electrode ELT1, whereby the first ends EP1 of the light emitting diodes LD may be physically and/or electrically connected to the first electrode ELT1. Likewise, the second contact electrode CNE2 may overlap both the second ends EP2 of the light emitting diodes LD and at least one area of the second electrode ELT2, whereby the second ends EP2 of the light emitting diodes LD may be physically and/or electrically connected to the second electrode ELT2.

In case that the voltage of the first power supply VDD (or a predetermined first control signal such as a scan signal or a data signal) is applied to the first ends EP1 of the light emitting diodes LD via the first power line PL1 and the first electrode ELT1, and the voltage of the second power supply VSS (or a predetermined second control signal such as a scan signal or a data signal) is applied to the second ends EP2 of the light emitting diodes LD via the second power line PL2 and the second electrode ELT2, at least one light emitting diode LD connected between the first and second electrodes ELT1 and ELT2 in the forward direction, may emit light. Therefore, the pixel PXL may emit light.

In an embodiment, the first electrode ELT1 and the second electrode ELT2 may be disposed on different layers of the substrate that are separated from each other with at least one insulating layer interposed therebetween. As such, if the first electrode ELT1 and the second electrode ELT2 are separately disposed on different layers, a short-circuit defect between the first electrode ELT1 and the second electrode ELT2 may be effectively prevented from occurring during a process of fabricating the pixel PXL. Detailed descriptions of a stacked structure of the light emitting device including the first electrode ELT1 and the second electrode ELT2 will be made below.

In an embodiment, the first electrode ELT1 and the second electrode ELT2 may be spaced apart from each other by a predetermined distance not to overlap each other in a plan view (for example, when viewed from top). For example, the first electrode ELT1 and the second electrode ELT2 may be disposed in a predetermined emission area at positions spaced apart from each other by a predetermined distance in the first direction DR1. In an embodiment, the interval and/or distance between the first electrode ELT1 and the second electrode ELT2 may remain constant or be changed by sections or areas. The light emitting diodes LD may be easily disposed in a desired area by adjusting the positions and/or intervals of the first and second electrodes ELT1 and ELT2.

Figure 7A:
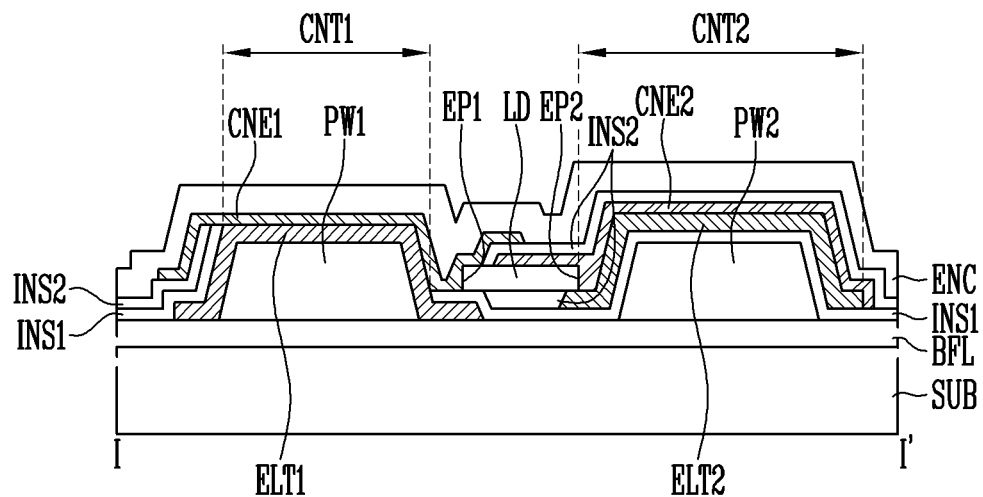
FIGS. 7A and 7B each are a cross-sectional view schematically illustrating a light emitting device in accordance with an embodiment of the disclosure and for example illustrate different embodiments of a cross-section corresponding to line I-I' of FIG. 6.
Figure 7B:
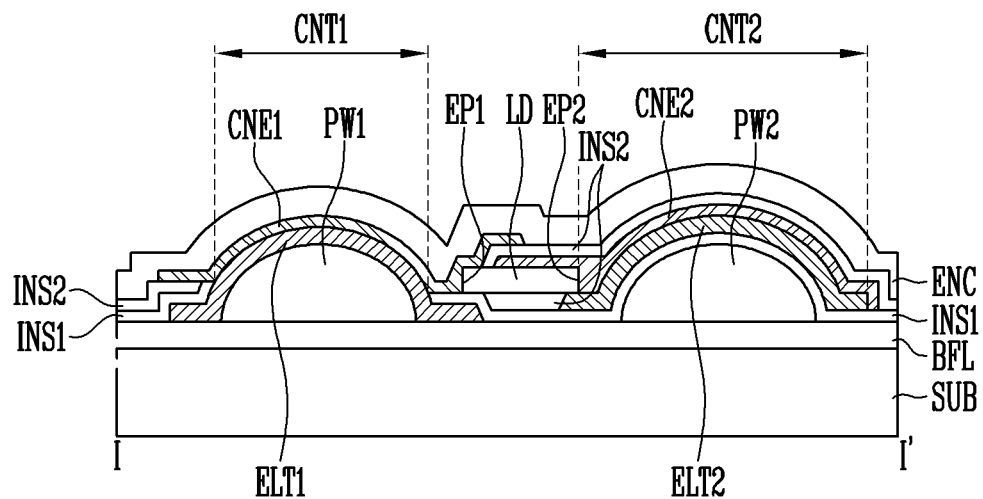

FIGS. 7A and 7B each are a cross-sectional view schematically illustrating a light emitting device in accordance with an embodiment and, for example, illustrate different embodiments of a cross-section corresponding to line I-I' of FIG. 6. In embodiments, the light emitting device of each of FIGS. 7A and 7B may correspond to a passive pixel PXL, and FIGS. 7A and 7B illustrate different embodiments with regard to the shapes of first and second partition walls PW1 and PW2. However, the light emitting device in accordance with the disclosure is not limited to the pixel PXL.

Referring to FIGS. 6, 7A, and 7B, the pixel PXL (or the light emitting device) in accordance with an embodiment may include a substrate SUB, and a buffer layer BFL, first and second partition walls PW1 and PW2, a first electrode ELT1, a first insulating layer INS1, a second electrode ELT2, at least one light emitting diode LD (e.g., light emitting diodes LD), a second contact electrode CNE2, a second insulating layer INS2, a first contact electrode CNE1, and an encapsulation layer ENC which are successively or sequentially disposed on a surface of the substrate SUB. For example, in an embodiment, based on the surface of the substrate SUB, the buffer layer BFL may be disposed on a first layer, the first and second partition walls PW1 and PW2 may be disposed on a second layer, the first electrode ELT1 may be provided on a third layer, the first insulating layer INS1 may be disposed on a fourth layer, the second electrode ELT2 may be disposed on a fifth layer, the light emitting diode LD may be disposed on a sixth layer, the second contact electrode CNE2 may be disposed on a seventh layer, the second insulating layer INS2 may be disposed on an eighth layer, the first contact electrode CNE1 may be disposed on a ninth layer, and the encapsulation layer ENC may be disposed on a tenth layer. Here, the above-defined respective positions of the components on the layers may be based on mutual arrangement relationship between the components disposed on the substrate SUB and/or a sequence of forming the components and may not be based on distances, heights, or the like from the substrate SUB. Furthermore, in some embodiments, at least one of the foregoing components may be omitted, or the position thereof may be changed. For example, the positions of the first electrode ELT1 and the second electrode ELT2 on the layers may be switched with each other. Likewise, the positions of the first contact electrode CNE1 and the second contact electrode CNE2 on the layers may be switched with each other. Furthermore, in an embodiment, at least one of the components illustrated in FIGS. 7A and 7B may be selectively omitted, or other additional components may be provided in each pixel PXL.

The substrate SUB may form a base of the display panel (e.g., the PNL of FIG. 4) including the pixel PXL and may be a rigid or flexible substrate. Furthermore, the substrate SUB may be a transparent substrate but is not limited thereto. In other words, in the disclosure, the material or property of the substrate SUB is not particularly limited. The buffer layer BFL may be disposed on the surface of the substrate SUB.

The buffer layer BFL may prevent impurities from diffusing into electrodes, lines, and/or a circuit element that are disposed on the buffer layer BFL. In an embodiment, the buffer layer BFL may be formed of a single layer or may be formed of multiple layers having two or more layers. In the case where the buffer layer BFL has a multilayer structure, the respective layers may be formed of the same or different materials. In an embodiment, the buffer layer BFL may be omitted. The buffer layer BFL may be selectively formed on the surface of the substrate SUB. The first partition wall PW1 and the second partition wall PW2 may be disposed on the surface of the substrate SUB on which the buffer layer BFL is formed.

The first partition wall PW1 and the second partition wall PW2 may be disposed on the surface of the substrate SUB at positions spaced apart from each other. For example, the first and second partition walls PW1 and PW2 may be disposed on the same layer on the substrate SUB at positions spaced apart from each other by a predetermined distance. However, the disclosure is not limited thereto, and the positions of the first and second partition walls PW1 and PW2 on the layers may be changed.

In an embodiment, the first partition wall PW1 may be disposed between the substrate SUB and an area of the first electrode ELT1. The second partition wall PW2 may be disposed between the substrate SUB and an area of the second electrode ELT2. In an embodiment, the first and second partition walls PW1 and PW2 may have substantially the same structure, shape, and/or height, but the disclosure is not limited thereto.

Each of the first and second partition walls PW1 and PW2 may have various shapes. For example, as illustrated in FIG. 7A, each of the first and second partition walls PW1 and PW2 may have a cross-sectional shape of a trapezoid, the width of which reduces from the bottom to the top thereof. In this case, each of the first and second partition walls PW1 and PW2 may have an inclined surface on at least a side thereof. In an embodiment, as illustrated in FIG. 7B, each of the first and second partition walls PW1 and PW2 may have a semi-circular or semi-elliptical cross-section, the width of which gradually reduces upward. In this case, each of the first and second partition walls PW1 and PW2 may have a curved surface on at least a side thereof. In other words, the shape of each of the first and second partition walls PW1 and PW2 is not limited to a particular shape and may be changed in various ways. In an embodiment, at least one of the first and second partition walls PW1 and PW2 may be omitted or changed in position.

In an embodiment, each of the first and second partition walls PW1 and PW2 may include insulating material having an inorganic material or an organic material. Furthermore, each of the first and second partition walls PW1 and PW2 may have a single-layer structure or a multi-layer structure. In other words, the material and/or the stacked structure of each of the first and second partition walls PW1 and PW2 is not limited to a particular material and/or stacked structure and may be changed in various ways.

In an embodiment, each of the first and second partition walls PW1 and PW2 may also function as a reflective member. For example, the first and second partition walls PW1 and PW2 may function as reflective members for enhancing the efficiency of light emitted from each light emitting diode LD, along with the first and second electrodes ELT1 and ELT2 provided on the first and second partition walls PW1 and PW2.

The first electrode ELT1 and the first contact electrode CNE1 may be disposed over the first partition wall PW1.

The second electrode ELT2 and the second contact electrode CNE2 may be disposed over the second partition wall PW2. In an embodiment, at least one insulating layer may be interposed between the first partition wall PW1 and the first electrode ELT1 and/or between the second partition wall PW2 and the second electrode ELT2. For example, the first insulating layer INS1 may be interposed between the second partition wall PW2 and the second electrode ELT2. In an embodiment, at least one electrode and/or insulating layer disposed over each of the first and second partition walls PW1 and PW2 may have a shape corresponding to that of the corresponding one of the first and second partition walls PW1 and PW2.

In detail, the first electrode ELT1 may be disposed on the surface of the substrate SUB on which the first and second partition walls PW1 and PW2 are formed. In an embodiment, the first electrode ELT1 may be any one pixel electrode, e.g., one of an anode electrode and a cathode electrode.

In an embodiment, the first electrode ELT1 may be disposed on at least one area of the first partition wall PW1. For example, the first electrode ELT1 may be disposed on the first partition wall PW1 to completely cover or overlap the first partition wall PW1.

The first electrode ELT1 may have a shape corresponding to that of the first partition wall PW1. For example, the first electrode ELT1 may have an inclined or curved surface corresponding to the shape of the first partition wall PW1. In an embodiment, the first partition wall PW1 may not be provided in the pixel PXL. In this case, the first electrode ELT1 may have a substantially planar shape.

In an embodiment, the first electrode ELT1 may include various conductive materials. For example, the first electrode ELT1 may have at least one reflective electrode layer, but the disclosure is not limited thereto.

For instance, the first electrode ELT1 may include conductive material having a predetermined reflectivity. For example, the first electrode ELT1 may include at least one of a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), and a conductive polymer such as PEDOT, but the disclosure is not limited thereto. In other words, the material for forming the first electrode ELT1 is not particularly limited, and the first electrode ELT1 may include various well-known electrode materials.

Furthermore, the first electrode ELT1 may be configured of or formed of a single layer or multiple layers, and the stacked structure thereof is not limited thereto. For example, the first electrode ELT1 may have a multi-layer structure including at least one reflective electrode layer and at least one conductive capping layer. Furthermore, the first electrode ELT1 may selectively further include at least one transparent electrode layer.

For example, the first electrode ELT1 may include at least one reflective electrode layer, at least one transparent electrode layer disposed over and/or under the reflective electrode layer, and at least one conductive capping layer configured to cover or overlap an upper portion of the reflective electrode layer and/or the transparent electrode layer. In an embodiment, the reflective electrode layer may be formed of various conductive materials, e.g., Ag, having reflectivity, and the constituent material thereof is not particularly limited. In the case where the first electrode ELT1 includes a reflective electrode layer, the first electrode ELT1 may enable light emitted from the opposite ends of each of the light emitting diodes LD, i.e., the first and second ends EP1 and EP2, to travel in a direction (e.g., in a frontal direction) in which an image is displayed. For example, if the first electrode ELT1 has an inclination corresponding to the shape of the first partition wall PW1, light emitted from the first end EP1 of each light emitting diode LD may be reflected by the first electrode ELT1 and more effectively travel in the frontal direction. Therefore, the efficiency of light emitted from the light emitting diodes LD may be enhanced.

Furthermore, if the first electrode ELT1 has a multi-layer structure including at least one transparent electrode layer disposed over and/or under the reflective electrode layer, a voltage drop due to a signal delay (RC delay) may be reduced or minimized. Therefore, a desired voltage can be effectively transmitted to the light emitting diodes LD. In an embodiment, the transparent electrode layer may be formed of various transparent conductive materials including ITO, and the material thereof is not particularly limited.

If the first electrode ELT1 includes a conductive capping layer covering the reflective electrode layer and/or the transparent electrode layer, it is possible to prevent the reflective electrode layer of the first electrode ELT1 from being damaged because of defects caused during the process of manufacturing the pixel PXL. However, the conductive capping layer may be selectively included in the first electrode ELT1 and may also be omitted in some embodiments. Furthermore, the conductive capping layer may be regarded as a component of the first electrode ELT1 or a separate component disposed on the first electrode ELT1.

The first insulating layer INS1 may be disposed on the substrate SUB on which the first electrode ELT1 is formed. For example, the first insulating layer INS1 may be disposed on the substrate SUB to overlap at least one area of the first electrode ELT1. In an embodiment, the first insulating layer INS1 may be disposed on the second partition wall PW2 such that an area of the first insulating layer INS1 is interposed between the second partition wall PW2 and the second electrode ELT2, but the disclosure is not limited thereto. For example, in an embodiment, the first insulating layer INS1 may be disposed under the second partition wall PW2 such that the first insulating layer INS1 is interposed between the substrate SUB and the second partition wall PW2.

The first insulating layer INS1 may have a single- or multi-layer structure including at least one organic and/or inorganic layer and be formed of various known insulating materials. For example, the first insulating layer INS1 may include at least one inorganic layer formed of $SiN_x$, but the disclosure is not limited thereto. In other words, the first insulating layer INS1 may include various known insulating materials.

In an embodiment, the first insulating layer INS1 may include an opening which exposes an area of the first electrode ELT1. For example, the first insulating layer INS1 may have an opening corresponding to a predetermined first contact portion CNT1.

The second electrode ELT2 may be disposed on the substrate SUB on which the first insulating layer INS1 is formed. In an embodiment, the second electrode ELT2 may be any one pixel electrode, e.g., one of an anode electrode and a cathode electrode. For example, if the first electrode ELT1 may be an anode electrode, the second electrode ELT2 may be a cathode electrode. In contrast, if the first electrode ELT1 may be a cathode electrode, the second electrode ELT2 may be an anode electrode.

The second electrode ELT2 may be disposed on the first insulating layer INS1 at a position spaced apart from the first electrode ELT1. In other words, the second electrode ELT2 may be disposed on a layer different from that of the first electrode ELT1 with the first insulating layer INS1 interposed therebetween.

Furthermore, the second electrode ELT2 may be disposed on at least one area of the second partition wall PW2. For example, the second electrode ELT2 may be disposed on the second partition wall PW2 to completely overlap the second partition wall PW2.

The second electrode ELT2 may have a shape corresponding to that of the second partition wall PW2. For example, the second electrode ELT2 may have an inclined or curved surface corresponding to the shape of the second partition wall PW2. In an embodiment, the second partition wall PW2 may not be provided in the pixel PXL. In this case, the second electrode ELT2 may have a substantially planar shape.

In an embodiment, the second electrode ELT2 may have various conductive materials. For example, the second electrode ELT2 may have at least one reflective electrode layer, but the disclosure is not limited thereto.

For instance, the second electrode ELT2 may include conductive material having a predetermined reflectivity. For example, the second electrode ELT2 may include at least one of a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), and a conductive polymer such as PEDOT, but the disclosure is not limited thereto. In other words, the material for forming the second electrode ELT2 is not particularly limited, and the second electrode ELT2 may have various well-known electrode materials. Furthermore, the second electrode ELT2 and the first electrode ELT1 may include the same or different conductive material.

Furthermore, the second electrode ELT2 may be configured or formed of a single layer or multiple layers, and the stacked structure thereof is not limited thereto. For example, the second electrode ELT2 may have a multi-layer structure including at least one reflective electrode layer and at least one conductive capping layer. Furthermore, the second electrode ELT2 may selectively further include at least one transparent electrode layer.

For example, the second electrode ELT2 may include at least one reflective electrode layer, at least one transparent electrode layer disposed over and/or under the reflective electrode layer, and at least one conductive capping layer configured to overlap an upper portion of the reflective electrode layer and/or the transparent electrode layer. In an embodiment, the reflective electrode layer may be formed of various conductive materials, e.g., Ag, having reflectivity, and the material thereof is not particularly limited.

In the case where the second electrode ELT2 includes a reflective electrode layer, the second electrode ELT2 may enable light emitted from the opposite ends of each of the light emitting diodes LD, for example, the first and second ends EP1 and EP2, to travel in a direction (e.g., a frontal direction) in which an image is displayed. For example, if the second electrode ELT2 has an inclination corresponding to the shape of the second partition wall PW2, light emitted from the second end EP2 of each light emitting diode LD may be reflected by the second electrode ELT2 and more effectively travel in the frontal direction. Therefore, the efficiency of light emitted from the light emitting diodes LD may be enhanced.

Furthermore, if the second electrode ELT2 has a multi-layer structure including at least one transparent electrode layer disposed over and/or under the reflective electrode layer, a voltage drop due to a signal delay (RC delay) may be reduced or minimized. Thus, a desired voltage can be effectively transmitted to the light emitting diodes LD. In an embodiment, the transparent electrode layer may be formed of various transparent conductive materials including ITO, and the constituent material thereof is not particularly limited.

If the second electrode ELT2 includes a conductive capping layer overlapping the reflective electrode layer and/or the transparent electrode layer, the reflective electrode layer of the second electrode ELT2 may be prevented from being damaged because of defects caused during the process of manufacturing the pixel PXL. However, the conductive capping layer may be selectively included in the second electrode ELT2 and may be omitted in some embodiments. Furthermore, the conductive capping layer may be regarded as a component of the second electrode ELT2 or a separate component disposed on the second electrode ELT2.

At least one light emitting diode LD may be disposed on the substrate SUB on which the second electrode ELT2 is formed. For example, light emitting diodes LD may be disposed in each pixel area in which each pixel PXL is formed.

In an embodiment, the light emitting diodes LD may be arranged between the first electrode ELT1 and the second electrode ELT2 in the horizontal direction in a plan view (e.g., when viewed from above the substrate SUB). For example, each light emitting diode LD may have a first end EP1 and a second end EP2 on opposite sides with respect to the longitudinal direction thereof. The first end EP1 of the light emitting diode LD may be disposed to face the first electrode ELT1, and the second end EP2 of the light emitting diode LD may be disposed to face the second electrode ELT2.

The second contact electrode CNE2 may be disposed on the substrate SUB on which the light emitting diodes LD are disposed. For example, the second contact electrode CNE2 may be disposed to overlap the second ends EP2 of the light emitting diodes LD and at least one area of the second electrode ELT2.

For example, the second contact electrode CNE2 may be disposed over the light emitting diodes LD and the second electrode ELT2 such that the second contact electrode CNE2 directly contacts the second ends EP2 of the light emitting diodes LD and the at least one area of the second electrode ELT2. For example, an area of the second contact electrode CNE2 may be disposed on the second ends EP2 of the light emitting diodes LD and thus directly contact the second ends EP2. Another area of the second contact electrode CNE2 may be disposed on the second electrode ELT2 in a second contact portion CNT2 and thus directly contact the second electrode ELT2. The second contact electrode CNE2 may stably support the second ends EP2 of the light emitting diodes LD and electrically connect the second ends EP2 to the second electrode ELT2.

In an embodiment, the second contact electrode CNE2 may be substantially transparent or translucent. For example, the second contact electrode CNE2 may be formed of transparent conductive material including ITO or IZO and may also be made of various known transparent conductive materials. Therefore, light generated from each light emitting diode LD may be emitted from the light emitting diode LD through the second contact electrode CNE2.

The second insulating layer INS2 may be disposed on the substrate SUB on which the second contact electrode CNE2 is formed. For example, the second insulating layer INS2 may be disposed on the second contact electrode CNE2 to overlap at least the second contact electrode CNE2. An end of the second insulating layer INS2 may be interposed between the first contact electrode CNE1 and the second contact electrode CNE2. Therefore, the first contact electrode CNE1 and the second contact electrode CNE2 may be reliably separated from each other, so that electrical stability between the first contact electrode CNE1 and the second contact electrode CNE2 can be secured. In other words, a short-circuit defect between the first contact electrode CNE1 and the second contact electrode CNE2 may be prevented by the second insulating layer INS2.

In an embodiment, the second insulating layer INS2 may have a single- or multi-layer structure including at least one organic layer and/or inorganic layer and may be formed of various known insulating materials. For example, the second insulating layer INS2 may include at least one inorganic layer formed of $SiN_x$, but the disclosure is not limited thereto. In other words, the second insulating layer INS2 may include various known insulating materials. Furthermore, the second insulating layer INS2 and the first insulating layer INS1 may include the same or different insulating material.

In the case where a space is present between the first insulating layer INS1 and the light emitting diodes LD, the space may be filled with the second insulating layer INS2 during a process of forming the second insulating layer INS2. Therefore, the light emitting diodes LD may be more stably supported. Furthermore, in the case where the first insulating layer INS1 and the second insulating layer INS2 are formed of (or include) the same material, the first and second insulating layers INS1 and INS2 may form an integrated insulating layer rather than being divided into separate insulating layers under the light emitting diodes LD.

The first contact electrode CNE1 may be disposed on the substrate SUB on which the second insulating layer INS2 is formed. For example, the first contact electrode CNE1 may be disposed to overlap the first ends EP1 of the light emitting diodes LD and at least one area of the first electrode ELT1.

For example, the first contact electrode CNE1 may be disposed over the light emitting diodes LD and the first electrode ELT1 such that the first contact electrode CNE1 directly contacts the first ends EP1 of the light emitting diodes LD and the at least one area of the first electrode ELT1. For example, the area of the first contact electrode CNE1 may be disposed on the first ends EP1 of the light emitting diodes LD and directly contact the first ends EP1. Another area of the first contact electrode CNE1 may be disposed on the first electrode ELT1 exposed through an opening of the first insulating layer INS1 to make direct contact with the first electrode ELT1. The first contact electrode CNE1 may stably support the first ends EP1 of the light emitting diodes LD and electrically connect the first ends EP1 to the first electrode ELT1.

In an embodiment, the first contact electrode CNE1 may be substantially transparent or translucent. For example, the first contact electrode CNE1 may be formed of transparent conductive material including ITO or IZO and may also be made of various known transparent conductive materials. Therefore, light generated from each light emitting diode LD may be emitted from the light emitting diode LD through the first contact electrode CNE1. Furthermore, the first contact electrode CNE1 and the second contact electrode CNE2 may include the same or different conductive material.

At least one insulating layer may be disposed on the substrate SUB on which the first and second contact electrodes CNE1 and CNE2 are formed. For example, the surface of the substrate SUB on which the first and second contact electrodes CNE1 and CNE2 are formed may be overlapped by at least one insulating layer. In an embodiment, the at least one insulating layer may include an encapsulation layer ENC (or an overcoat layer).

The encapsulation layer ENC may be formed of a single layer or multiple layers. For example, the encapsulation layer ENC may be a thin film encapsulation layer which includes inorganic insulating layers overlapping each other and at least one organic insulating layer interposed between the inorganic insulating layers. However, the constituent material and/or sectional structure of the encapsulation layer ENC is not particularly limited and may be changed in various ways. In an embodiment, the encapsulation layer ENC may overlap at least a display area (e.g., the DA of FIG. 4) and protect the pixels PXL. In an embodiment, not only the encapsulation layer ENC but also at least one passivation layer, optical layer, or the like may be disposed on the surface of the substrate SUB on which the light emitting diodes LD or the like are disposed.

As described above, in an embodiment, the first electrode ELT1 and the second electrode ELT2 may be respectively disposed on different layers on the substrate SUB that are separated from each other with the first insulating layer INS1 interposed therebetween. As such, if the first electrode ELT1 and the second electrode ELT2 are separately disposed on different layers, a short-circuit defect between the first electrode ELT1 and the second electrode ELT2 may be effectively prevented from occurring at the process of fabricating the pixel PXL (or the light emitting device).

Furthermore, as described with reference to the foregoing embodiment, if the first electrode ELT1 and the second electrode ELT2 are separately disposed on different layers, the distance between the first electrode ELT1 and the second electrode ELT2 which may be set taking into account a process margin or the like may be further reduced, compared to that of pixels of other embodiments (or light emitting devices of other embodiments) in which the first electrode ELT1 and the second electrode ELT2 are formed on the same layer. If the distance between the first electrode ELT1 and the second electrode ELT2 is reduced, a stronger electric field may be formed between the first electrode ELT1 and the second electrode ELT2 even in case that the voltages applied to the first electrode ELT1 and the second electrode ELT2 are the same as that of the foregoing embodiment. Therefore, the light emitting diode LD may be efficiently aligned between the first electrode ELT1 and the second electrode ELT2, and the quality of the alignment can be enhanced.

In other words, according to the foregoing embodiment, at least one light emitting diode LD may be reliably arranged between the first electrode ELT1 and the second electrode ELT2, and a short-circuit defect between the first electrode ELT1 and the second electrode ELT2 may be effectively prevented or mitigated.

Figure 8:
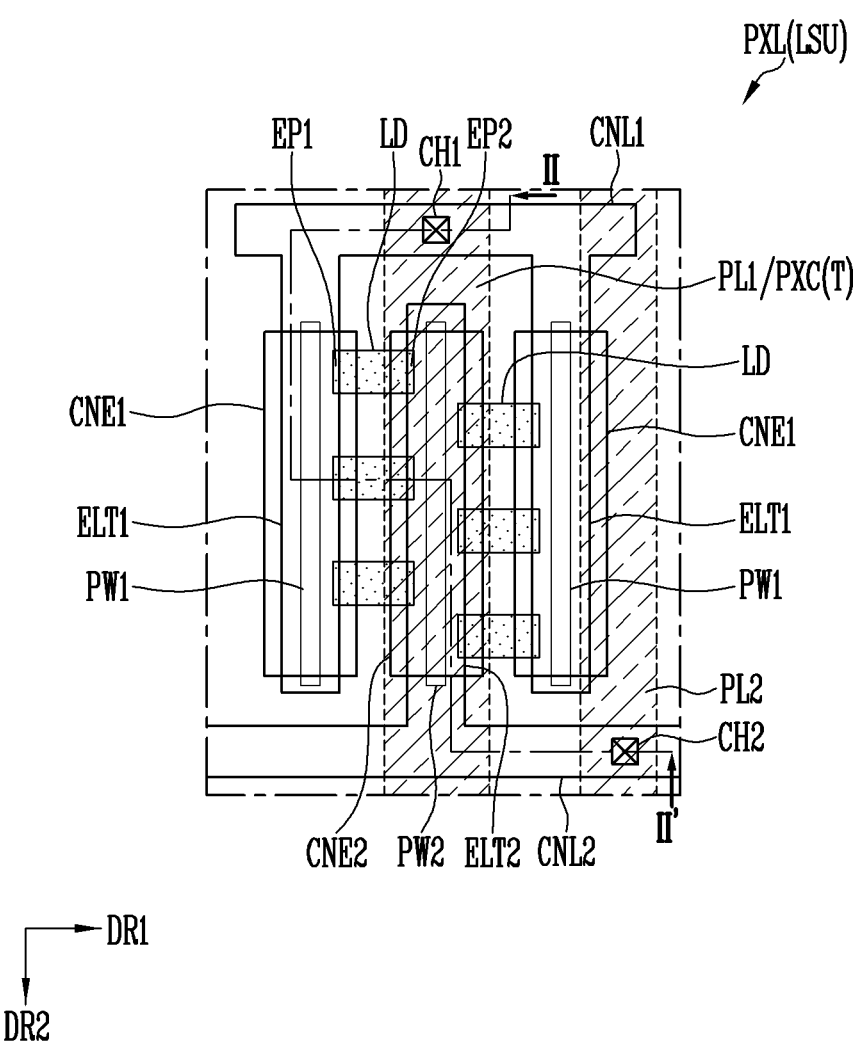
FIG. 8 is a plan view schematically illustrating a light emitting device in accordance with an embodiment of the disclosure and for example illustrating an example of a pixel including the light emitting device.
Figure 9A:
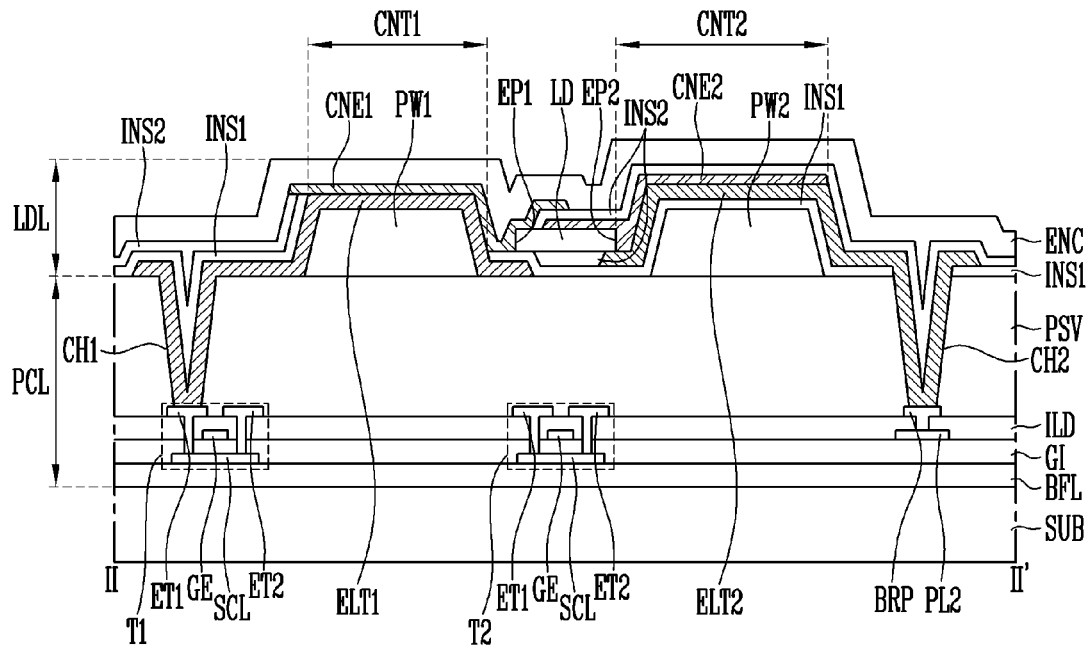
FIGS. 9A and 9B each are a cross-sectional view schematically illustrating a light emitting device in accordance with an embodiment of the disclosure and for example illustrate different embodiments of a cross-section corresponding to line of FIG. 8.
Figure 9B:
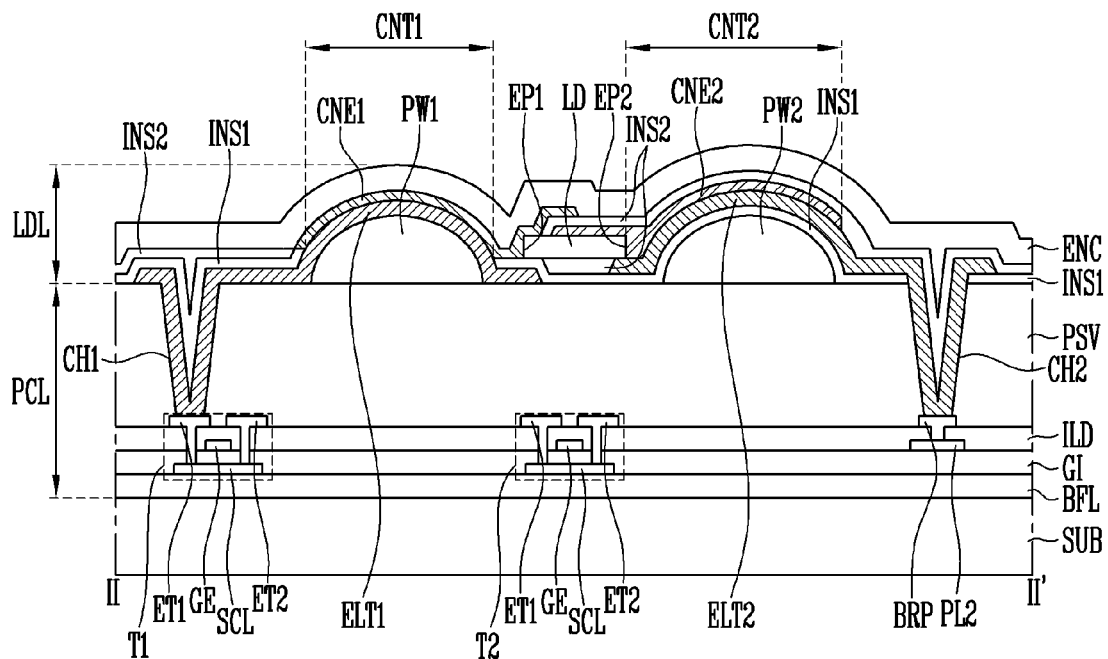

FIG. 8 is a schematic plan view illustrating a light emitting device in accordance with an embodiment and, for example, illustrates an example of a pixel PXL including the light emitting device. FIGS. 9A and 9B each are a schematic sectional view illustrating a light emitting device in accordance with an embodiment and for example illustrate different embodiments of a cross-section corresponding to line II-II' of FIG. 8.

In an embodiment, FIGS. 8 to 9B illustrate a light emitting device (e.g., a pixel PXL of an active light emitting display device) in which first and/or second electrodes ELT1 and ELT2 are respectively connected to a first power line PL1 and a second power line PL2 through at least one contact hole, or the first and/or second electrodes ELT1 and ELT2 is connected to the first power line PL1 or the second power line PL2 via at least one circuit element (e.g., at least one transistor T included in the pixel circuit PXC (e.g., transistors T1 to T7)).

In an embodiment, the light source unit LSU illustrated in FIG. 8 may have a configuration substantially similar or identical to that of the light emitting device (or the pixel PXL) according to the above-described embodiment, e.g., the embodiment illustrated in FIG. 6. Furthermore, the display element layer LDL illustrated in FIGS. 9A and 9B may have a cross-section substantially similar or identical to that of the light emitting device (or the pixel PXL) according to the embodiment illustrated in FIGS. 7A and 7B. In the following descriptions of the embodiments of FIGS. 8 to 9B, like reference numerals are used to indicate the identical or similar components to those of the embodiments of FIGS. 6 to 7B, and detailed descriptions thereof will be omitted.

Referring to FIGS. 4 to 9B, each pixel PXL may include a display element layer LDL including a first electrode ELT1, a second electrode ELT2, at least one light emitting diode LD, and a circuit element layer PCL disposed under the display element layer LDL. For example, the circuit element layer PCL may be disposed between the substrate SUB and the display element layer LDL.

In an embodiment, the circuit element layer PCL may include circuit elements disposed in the display area DA. For example, the circuit element layer PCL may include circuit elements which are disposed in respective pixel areas to form the respective pixel circuits PXC. In other words, in an embodiment, the circuit element layer PCL may be a pixel circuit layer.

For example, the circuit element layer PCL may include transistors T disposed in each pixel area, e.g., the first and second transistors T1 and T2 of FIGS. 5A and 5B, and at least one capacitor, e.g., the storage capacitor Cst of FIGS. 5A and 5B. Furthermore, the circuit element layer PCL may further include at least one scan line Si, a data line Dj, a first power line PL1, and/or a second power line PL2.

In an embodiment, transistors T provided in each pixel circuit PXC, e.g., the first and second transistors T1 and T2, may have substantially the same or similar cross-sectional structure. However, the disclosure is not limited thereto. In an embodiment, at least some of the transistors T may have different types and/or structures.

The circuit element layer PCL may include insulating layers. For example, the circuit element layer PCL may include a buffer layer BFL, a gate insulating layer GI, an interlayer insulating layer ILD, and a passivation layer PSV which are successively or sequentially stacked on the surface of the substrate SUB.

In an embodiment, the buffer layer BFL may prevent impurities from diffusing into each circuit element. The buffer layer BFL may be formed of a single layer or may be formed of multiple layers having two or more layers. In the case where the buffer layer BFL has a multilayer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIGS. 9A and 9B illustrate an embodiment in which each of the first and second transistors T1 and T2 includes the first transistor electrode ET1 and the second transistor electrode ET2 that are formed separately from the semiconductor layer SCL, the disclosure is not limited thereto. For example, in an embodiment, the first and/or second transistor electrode ET1 and ET2 provided in at least one transistor T that forms each pixel circuit PXC may be integral with the corresponding semiconductor layer SCL.

The semiconductor layer SCL may be disposed on the buffer layer BFL. For example, the semiconductor layer SCL may be disposed between the gate insulating layer GI and the substrate SUB on which the buffer layer BFL is formed. The semiconductor layer SCL may include a first area contacting the first transistor electrode ET1, a second area contacting the second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first and second areas of the semiconductor layer SCL through corresponding contact holes which pass through the gate insulating layer GI and the interlayer insulating layer ILD.

In an embodiment, any one of the first and second transistor electrodes ET1 and ET2 of at least one transistor T (e.g., the first transistor T1 of FIGS. 5A and 5B) provided in the pixel circuit PXC may be electrically connected to the first electrode ELT1 of the light source unit LSU disposed on the passivation layer PSV through the first contact hole CH1 passing through the passivation layer PSV.

In an embodiment, at least one signal line and/or power line that is connected to each pixel PXL may be disposed on a layer identical to that of an electrode of each of the circuit elements that form the pixel circuit PXC. For example, the second power line PL2 for supplying the second power supply VSS may be disposed on a layer identical to that of the gate electrodes GE of the first and second transistors T1 and T2 and may be electrically connected to the second electrode ELT2 of the light source unit LSU that is disposed on the passivation layer PSV through a bridge pattern BRP disposed on the layer identical to that of the first and second transistor electrodes ET1 and ET2 and through at least one second contact hole CH2 passing through the passivation layer PSV. However, the structure and/or position of the second power line PL2 may be changed in various ways.

The display element layer LDL may be a layer on which the light source unit LSU of each pixel PXL is disposed and, for example, may be configured in a manner identical to that of the light emitting device of the pixel PXL described with reference to FIGS. 6 to 7B. For example, the display element layer LDL may include at least one pair of first and second electrodes ELT1 and ELT2 disposed in each pixel area over the circuit element layer PCL, and at least one light emitting diode LD electrically connected between the first and second electrodes ELT1 and ELT2. For example, the display element layer LDL may include light emitting diodes LD which are disposed over the circuit element layer PCL in each pixel area and configure each light source unit LSU. The display element layer LDL may further include, e.g., at least one insulating layer (or an insulating pattern) and/or electrode. For example, the display element layer LDL may further include at least one of the first and second partition walls PW1 and PW2, the first and second insulating layers INS1 and INS2, the first and second contact electrodes CNE1 and CNE2, and the encapsulation layer ENC that are described with reference to FIGS. 6 to 7B.

In the above-mentioned embodiment, the light source unit LSU of each pixel PXL may be configured of (or formed of) a light emitting device including at least one light emitting diode LD. Since the light emitting device according to an embodiment has been described above, detailed descriptions of each light source unit LSU corresponding to the light emitting device and the display element layer LDL for configuring the light source unit LSU will be omitted.

In an embodiment, at least one first circuit element and/or line disposed in the circuit element layer PCL may overlap the first and/or second electrodes ELT1 and ELT2 of the display element layer LDL. For example, the first transistor T1 may overlap an area of the first electrode ELT1 (or the first connection electrode CNL1) and may be electrically connected to the first electrode ELT1 through the first contact hole CH1. As another example, in an embodiment, in case that the first electrode ELT1 is directly connected to the first power line PL1, an area of the first power line PL1 may overlap the first electrode ELT1 and may be electrically connected to the first electrode ELT1 through at least one contact hole.

In an embodiment, the second power line PL2 may overlap an area of the second electrode ELT2 (or the second connection electrode CNL2) and may be electrically connected to the second electrode ELT2 through the second contact hole CH2. In an embodiment, the second electrode ELT2 may be electrically connected to the second power line PL2 via at least one second circuit element. In this case, the second circuit element may overlap an area of the second electrode ELT2 (or the second connection electrode CNL2) and may be electrically connected to the second electrode ELT2 through at least one contact hole.

In an embodiment, the first circuit element or the area of the first power line PL1 that is electrically connected to the first electrode ELT1 may overlap the second electrode ELT2. Here, the first circuit element or the first power line PL1 may remain physically separated and/or electrically disconnected from the second electrode ELT2 by at least one insulating layer (e.g., at least one passivation layer PSV). Likewise, the second circuit element or the area of the second power line PL2 that is electrically connected to the second electrode ELT2 may overlap the first electrode ELT1. Here, the second circuit element or the second power line PL2 may remain physically separated and/or electrically disconnected from the first electrode ELT1 by at least one insulating layer. As such, if the circuit element layer PCL and the display element layer LDL overlap each other, the limited pixel area may be more efficiently used.

FIGS. 10A to 10K are schematic cross-sectional views illustrating a method of fabricating a light emitting device in accordance with an embodiment and, for example, illustrate a method of fabricating the light emitting device in accordance with the embodiment of FIG. 9A.

Figure 10A:
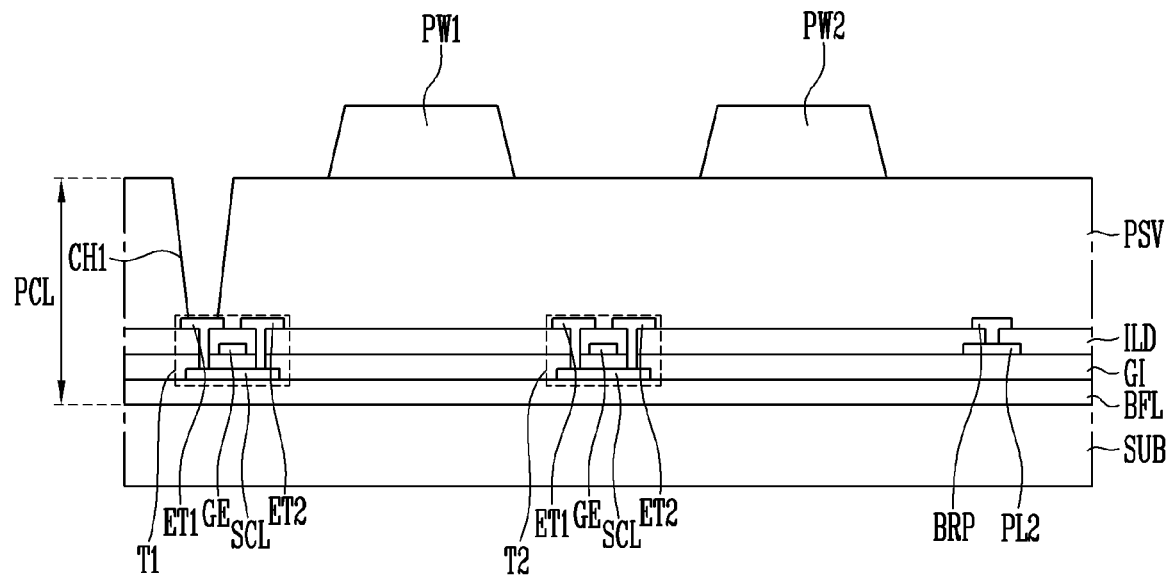
FIGS. 10A to 10K are cross-sectional views schematically illustrating a method of fabricating a light emitting device in accordance with an embodiment of the disclosure and for example illustrate a method of fabricating the light emitting device in accordance with the embodiment of FIG. 9A.

Referring to FIGS. 9A and 10A, the circuit element layer PCL may be formed on the surface of the substrate SUB, and the first and second partition walls PW1 and PW2 may be formed at positions spaced apart from each other on the substrate SUB on which the circuit element layer PCL is formed. Furthermore, the first contact hole CH1 may be formed to electrically connect the first circuit element (e.g., the first transistor T1) of the circuit element layer PCL with any one electrode (e.g., the first electrode ELT1) of the display element layer LDL. Here, in some embodiments, in the case where the circuit element layer PCL is omitted, the first and second partition walls PW1 and PW2 may be directly formed on the surface of the substrate SUB (or the substrate SUB on which the buffer layer BFL is formed).

In an embodiment, the first and second partition walls PW1 and PW2 may be formed by a process of forming an insulating layer including an inorganic material and/or an organic material and/or a patterning process (e.g., a photo or photolithography process) and may be formed by various types of known processes. In an embodiment, the first and second partition walls PW1 and PW2 may be simultaneously formed using the same material on the same layer (or the same plane) on the substrate SUB, but the disclosure is not limited thereto.

Figure 10B:
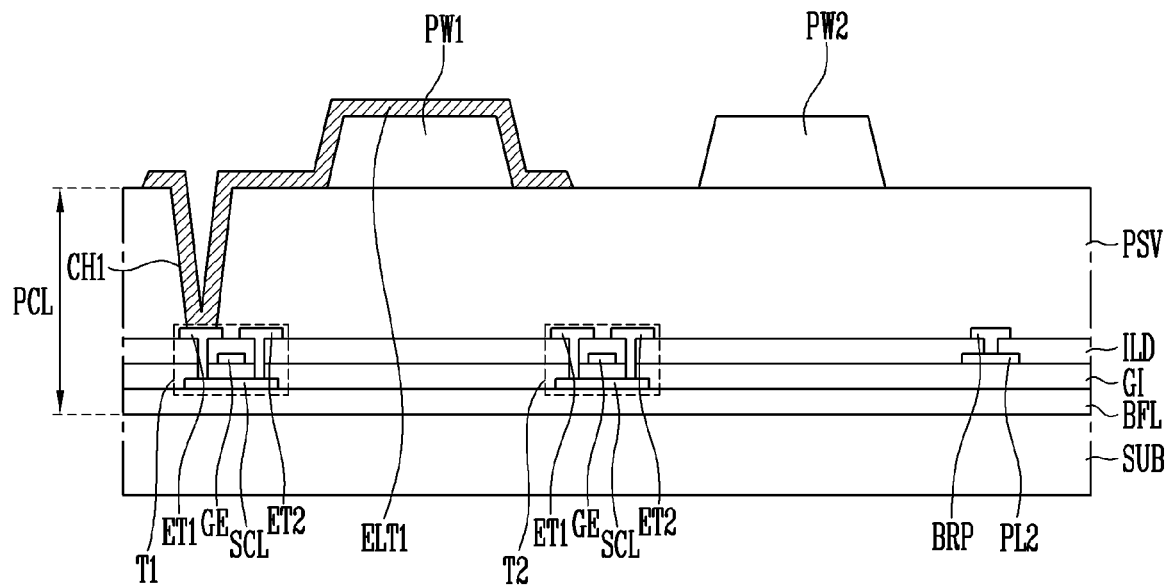

Referring to FIG. 10B, the first electrode ELT1 may be formed on the first partition wall PW1. Here, in some embodiments, in the case where the circuit element layer PCL and/or the first partition wall PW1 is omitted, the first electrode ELT1 may be directly formed on the surface of the substrate SUB (or the substrate SUB on which the buffer layer BFL is formed).

In an embodiment, the first electrode ELT1 may be formed by a process of forming a conductive layer including at least one conductive material and/or a patterning process and may be formed by various types of known processes. In an embodiment, the first electrode ELT1 may be formed of a single layer or multiple layers. For example, the first electrode ELT1 may be formed of a conductive pattern having a single-layer structure or a conductive pattern having a multi-layer structure including a first reflective electrode and a first conductive capping layer.

Figure 10C:
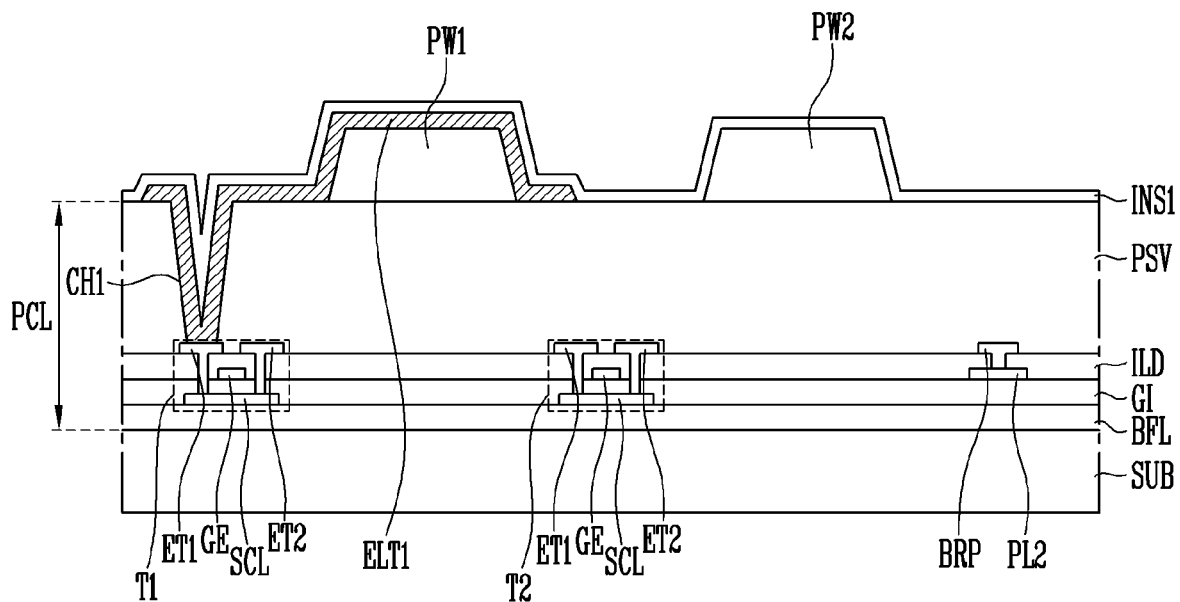

Referring to FIG. 10C, the first insulating layer INS1 may be formed on the substrate SUB and the first electrode ELT1. In an embodiment, the first insulating layer INS1 may be formed on the surface of the substrate SUB to overlap at least the first electrode ELT1. For example, the first insulating layer INS1 may be formed on the entire area of each pixel area.

In an embodiment, the first insulating layer INS1 may be formed by a deposition process of an insulating layer including an inorganic material and/or an organic material and may be formed by various types of known processes. In an embodiment, the first insulating layer INS1 may be formed of a single layer or multiple layers.

Figure 10D:
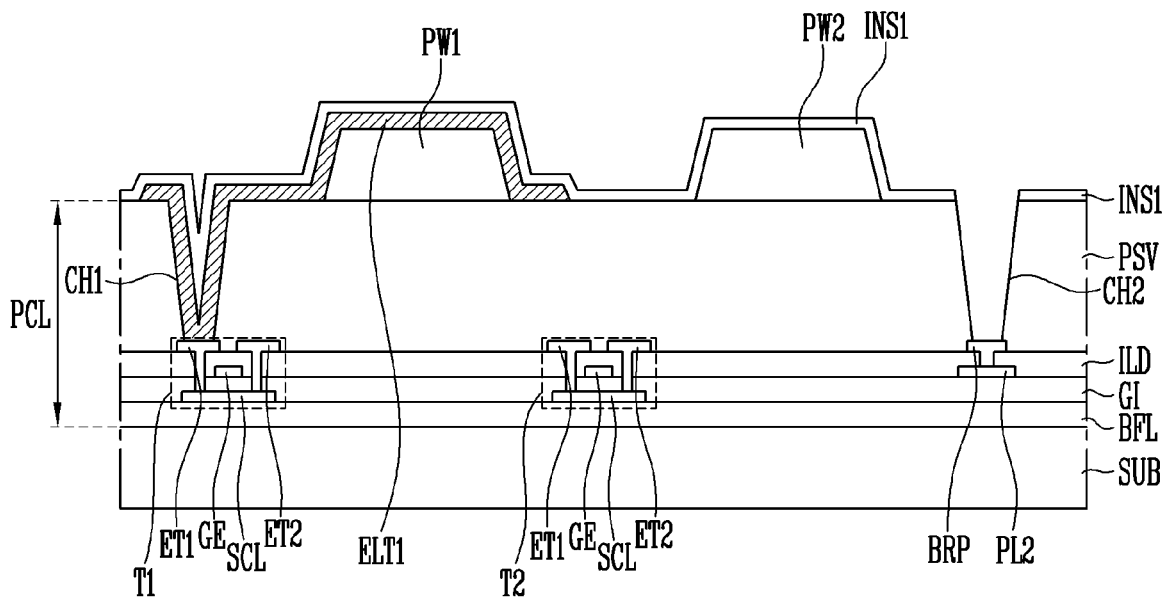

Referring to FIG. 10D, the second contact hole CH2 may be formed on the substrate SUB on which the first insulating layer INS1 is formed. For example, the second contact hole CH2 may be formed to expose the second power line PL2 or the bridge pattern BRP electrically connected to the second power line PL2.

Figure 10E:
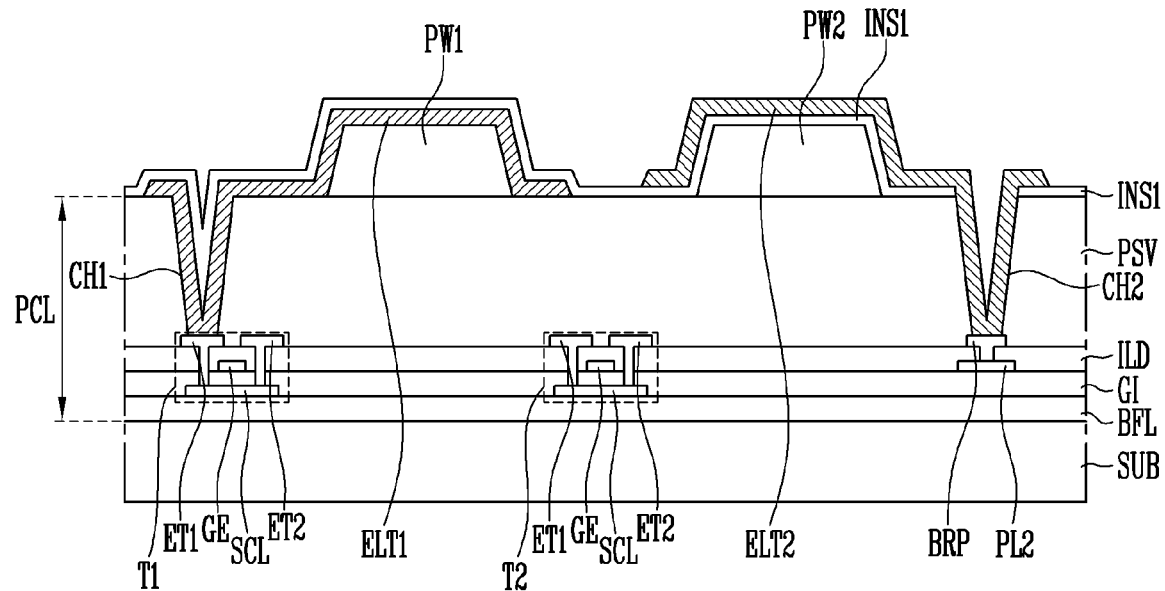

Referring to FIG. 10E, the second electrode ELT2 may be formed on the first insulating layer INS1 including an opening corresponding to the second contact hole CH2. In an embodiment, the second electrode ELT2 may be formed on the second partition wall PW2 and the second contact hole CH2. Furthermore, the second electrode ELT2 may be formed at a position spaced apart from the first electrode ELT1 by a predetermined distance not to overlap the first electrode ELT1.

In an embodiment, the second electrode ELT2 may be formed by a process of forming a conductive layer including at least one conductive material and/or a patterning process and may be formed by various types of known processes. In an embodiment, the second electrode ELT2 may be formed of a single layer or multiple layers. For example, the second electrode ELT2 may be formed of a conductive pattern having a single-layer structure or a conductive pattern having a multi-layer structure including a second reflective electrode and a second conductive capping layer.

Figure 10F:
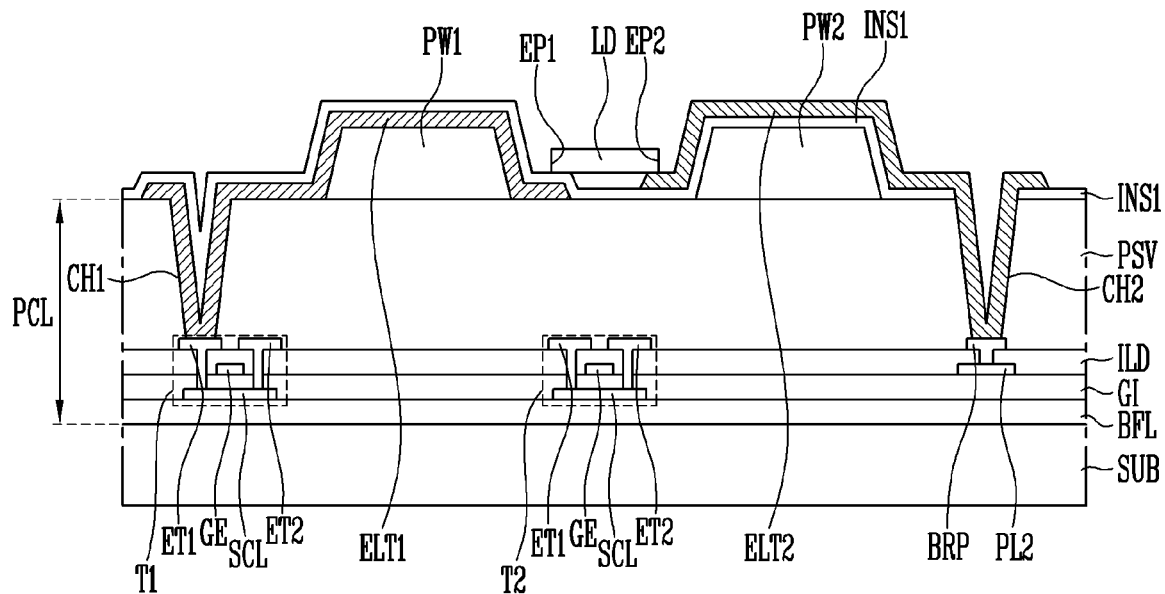

Referring to FIG. 10F, at least one light emitting diode LD may be supplied onto the substrate SUB and the first electrode ELT1, the second electrode ELT2, etc., and the light emitting diode LD may be aligned between the first electrode ELT1 and the second electrode ELT2. For example, light emitting diodes LD may be supplied to each pixel area including the first and second electrodes ELT1 and ELT2, and the light emitting diodes LD may be aligned by applying predetermined voltages (e.g., AC voltages) to the first and second electrodes ELT1 and ELT2.

In an embodiment, the light emitting diodes LD may be supplied to a predetermined emission area (e.g., an emission area of each pixel PXL) by applying a solution with the plurality of light emitting diodes LD dispersed therein to the substrate SUB using an inkjet printing method, a slit coating method, or the like. However, the method of supplying the light emitting diodes LD is not limited thereto, and the light emitting diodes LD may be supplied onto an area of the substrate SUB in various other ways. In an embodiment, an electric field may be formed by applying AC voltages between the first and second electrodes ELT1 and ELT2, but the type of voltage or signal to be applied between the first and second electrodes ELT1 and ELT2 is not limited thereto.

In an embodiment, each light emitting diode LD may be aligned between the first and second electrodes ELT1 and ELT2 in a horizontal direction. For example, the first end EP1 of each of the light emitting diodes LD may be disposed to face the first electrode ELT1. The second end EP2 of each of the light emitting diodes LD may be disposed to face the second electrode ELT2.

Figure 10G:
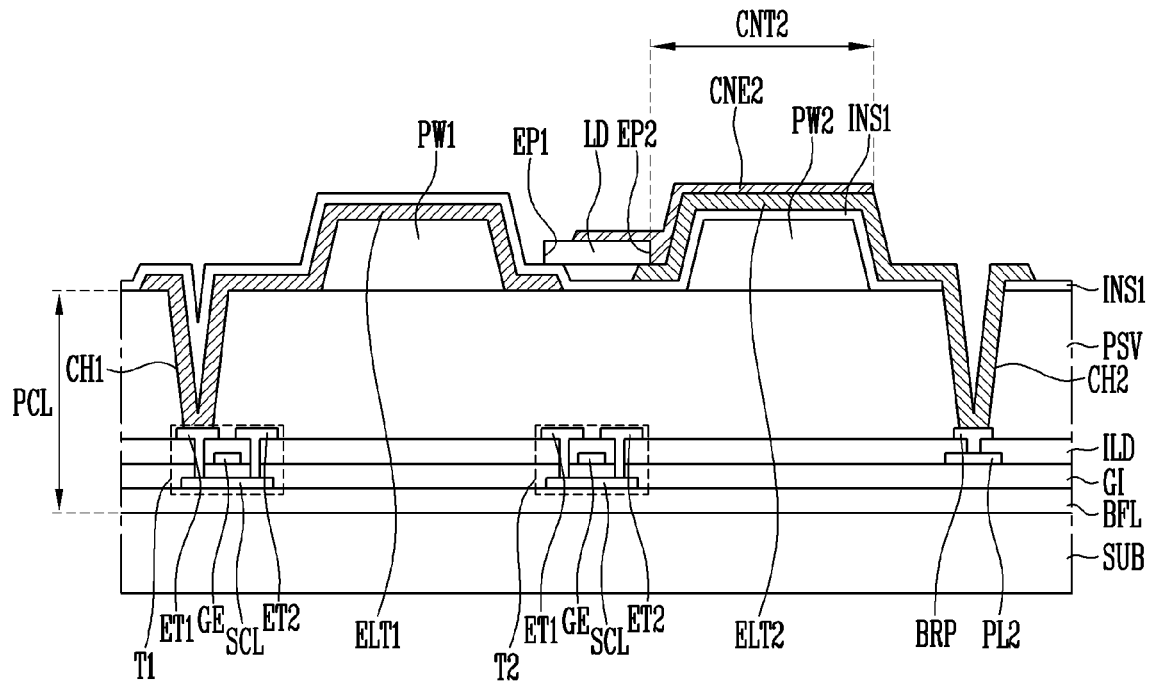

Referring to FIG. 10G, the second contact electrode CNE2 may be formed on the substrate SUB on which at least one light emitting diode LD is disposed. For example, to overlap the second end EP2 of the light emitting diode LD and an area (e.g., a predetermined second contact portion CNT2) of the second electrode ELT2, the second contact electrode CNE2 may be formed on the second end EP2 of the light emitting diode LD and at least one area of the second electrode ELT2. The second end EP2 of the light emitting diode LD may be electrically connected to the second electrode ELT2 by the second contact electrode CNE2.

In an embodiment, the second contact electrode CNE2 may be formed by a process of forming a conductive layer including at least one conductive material and/or a patterning process and may be formed by various types of known processes. In an embodiment, the second contact electrode CNE2 may be formed to be substantially transparent using at least one transparent electrode material.

Figure 10H:
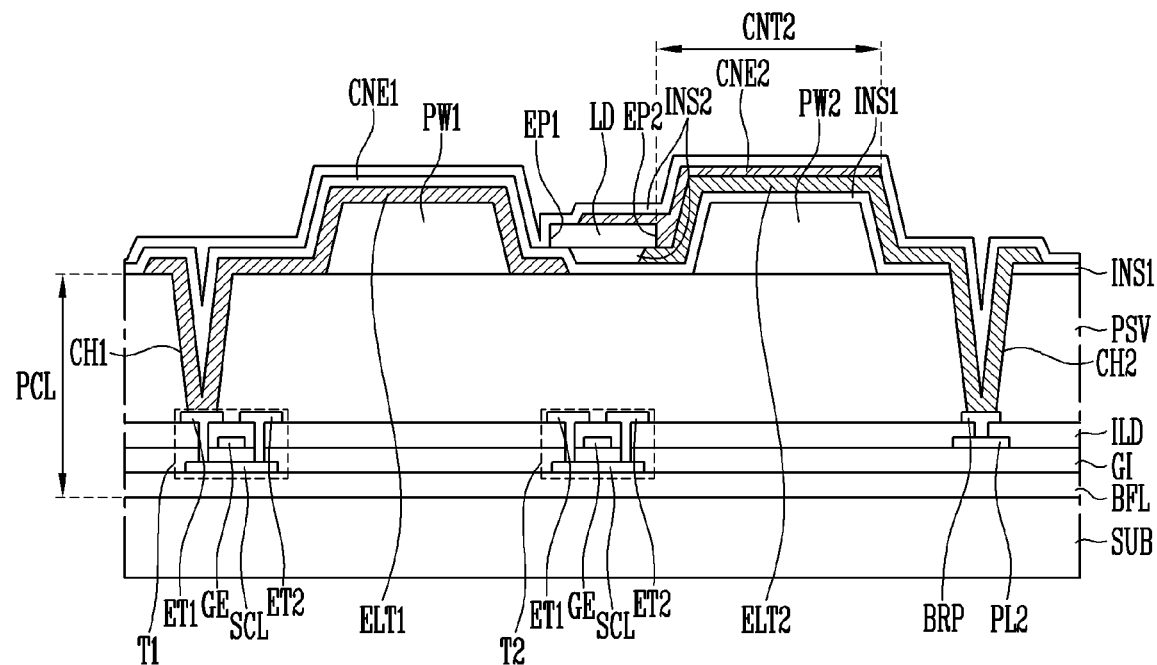

Referring to FIG. 10H, the second insulating layer INK may be formed on the substrate SUB and the second contact electrode CNE2. For example, the second insulating layer INS2 may be formed on the surface of the substrate SUB to overlap at least the second contact electrode CNE2. In an embodiment, in the case where a space has been present between the first insulating layer INS1 and the light emitting diodes LD at a previous processing step, insulating material for forming the second insulating layer INS2 may be formed in the space during a process of forming the second insulating layer INS2, so that the space may be filled with the insulating material.

In an embodiment, the second insulating layer INS2 may be formed by a deposition process of an insulating layer including an inorganic material and/or an organic material and may be formed by various types of known processes. The second insulating layer INS2 may be formed of a single layer or multiple layers.

Figure 10I:
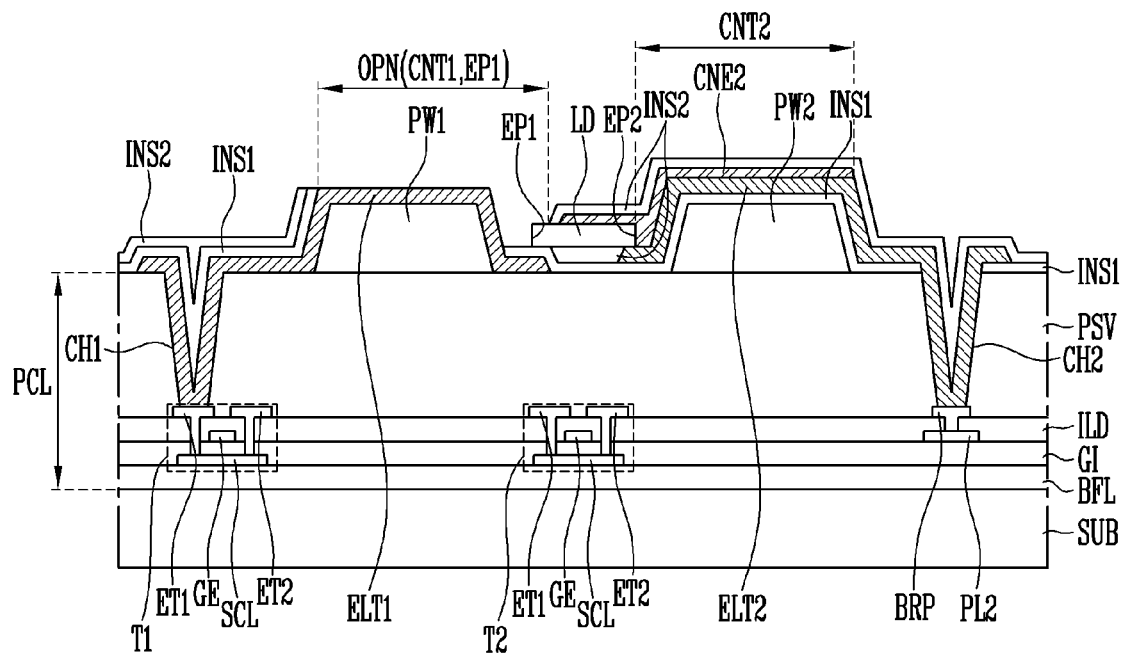

Referring to FIG. 10I, an opening OPN may be formed in the first and second insulating layers INS1 and INS2 by etching the first and second insulating layers INS1 and INS2 such that an area (e.g., a predetermined first contact portion CNT1) of the first electrode ELT1 and the first end EP1 of the light emitting diode LD are exposed. The first contact portion CNT1 may be formed on the first electrode ELT1. In an embodiment, the first contact portion CNT1 may be formed by a photolithography process or the like, but the disclosure is not limited thereto.

Figure 10J:
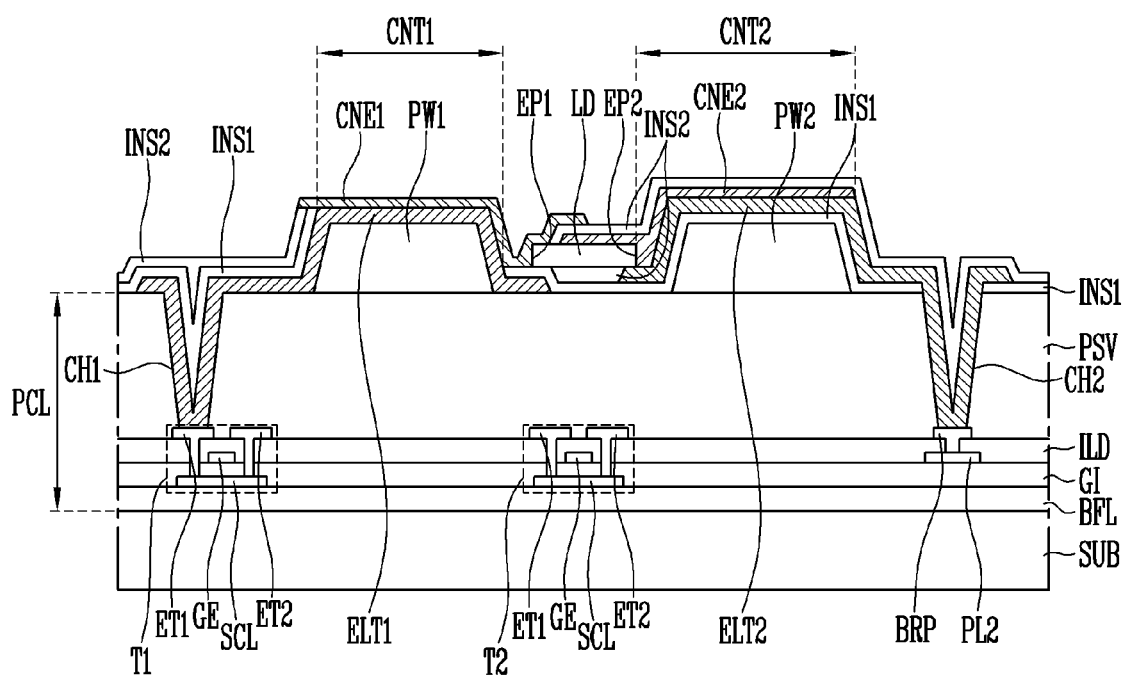

Referring to FIG. 10J, the first contact electrode CNE1 may be formed both on at least one area of the first electrode ELT1 including the first contact portion CNT1 and on the first end EP1 of the light emitting diode LD. The first end EP1 of the light emitting diode LD may be electrically connected to the first electrode ELT1 by the first contact electrode CNE1.

In an embodiment, the first contact electrode CNE1 may be formed by a process of forming a conductive layer including at least one conductive material and/or a patterning process and may be formed by various types of known processes. In an embodiment, the first contact electrode CNE1 may be formed to be substantially transparent using at least one transparent electrode material.

Figure 10K:
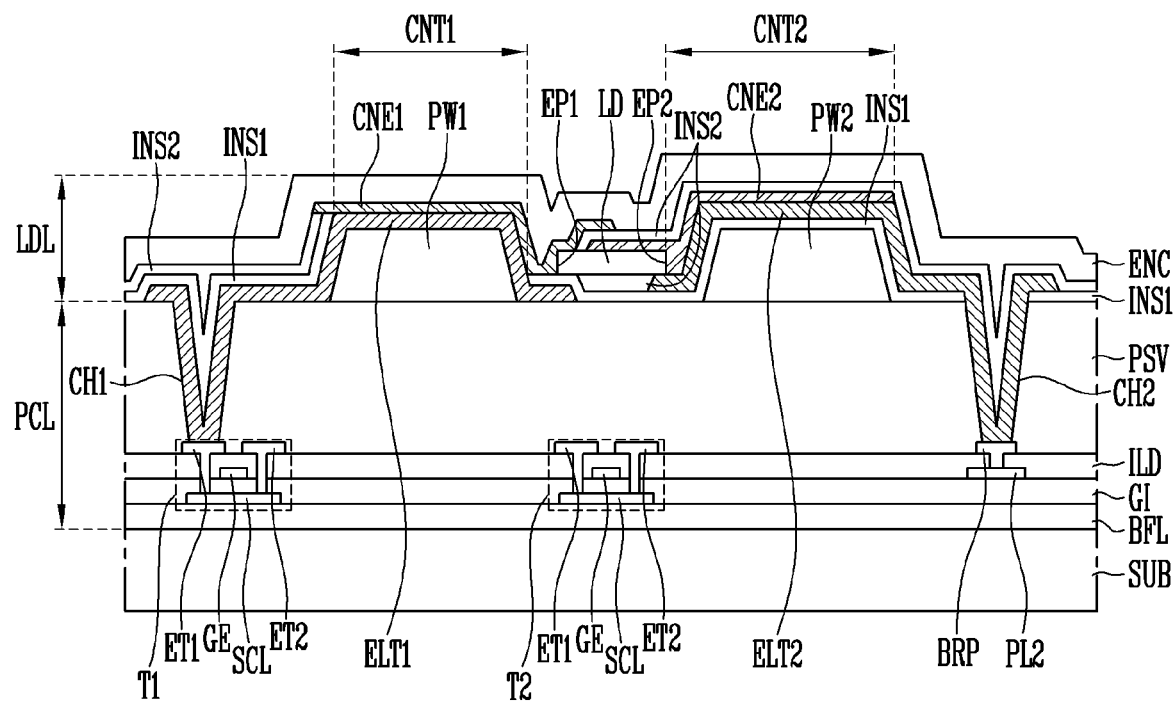

Referring to FIG. 10K, the encapsulation layer ENC (or the overcoat layer or the like) may be formed on the surface of the substrate SUB on which the first and second contact electrodes CNE1 and CNE2 are formed.

In an embodiment, the encapsulation layer ENC may be formed through a deposition process of an insulating layer including an inorganic material and/or an organic material and may be formed by various types of known processes. The encapsulation layer ENC may be formed of a single layer or multiple layers. In an embodiment, in lieu of the encapsulation layer ENC, at least one other passivation layer and/or encapsulation substrate may be formed on the surface of the substrate SUB on which the first and second contact electrodes CNE1 and CNE2 are formed.

By the above-mentioned process, the light emitting device according to an embodiment may be fabricated. For example, the display panel PNL including the pixel PXL illustrated in FIGS. 8 and 9A may be fabricated.

Figure 11:
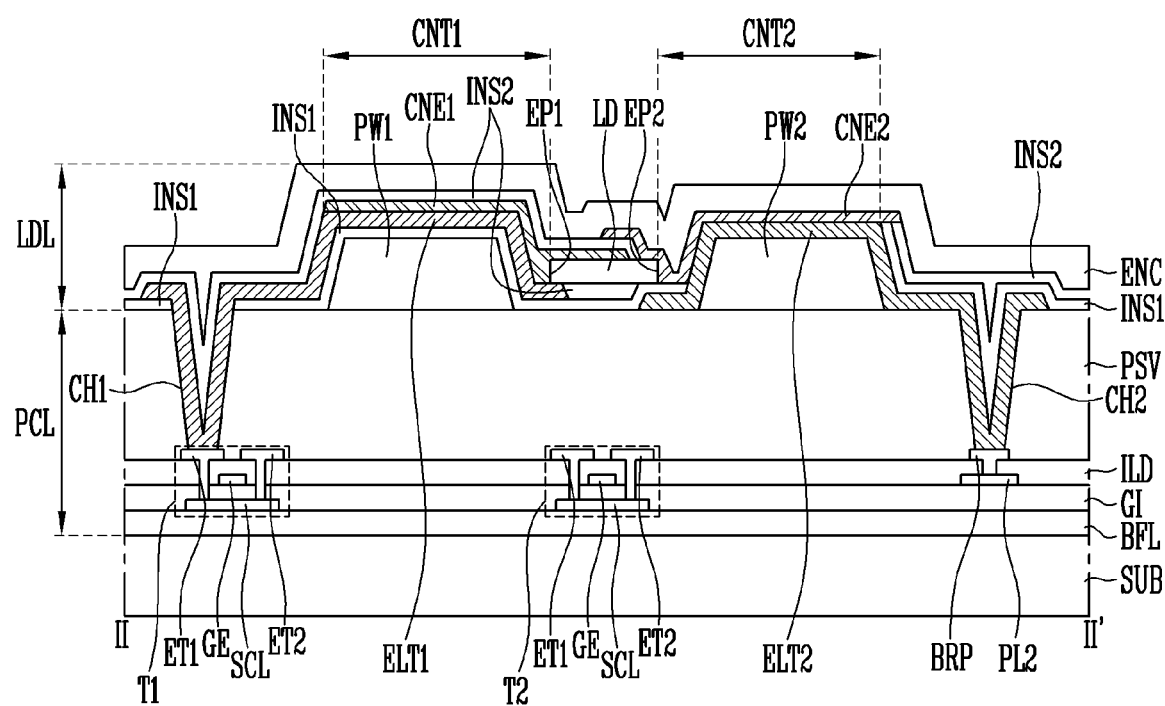
FIG. 11 is a cross-sectional view schematically illustrating a light emitting device in accordance with an embodiment of the disclosure and for example illustrates an embodiment of a cross-section corresponding to line II-IT of FIG. 8.

FIG. 11 is a schematic sectional view illustrating a light emitting device in accordance with an embodiment and, for example, illustrates an embodiment of a cross-section corresponding to line II-II' of FIG. 8. In an embodiment, FIG. 11 illustrates an embodiment different from that of FIG. 9A with regard to the positions of the first and second electrodes ELT1 and ELT2 on layers and the positions of the first and second contact electrodes CNE1 and CNE2 on layers. In the description of the embodiment of FIG. 11, like reference numerals are used to designate components similar or identical to those of the above-described embodiments, e.g., the embodiment of FIG. 9A, and detailed descriptions thereof will be omitted.

Referring to FIGS. 8, 9A, and 11, the positions (the stacked sequence) of the first electrode ELT1 and the second electrode ELT2 on layers may be changed in different embodiments. For example, the second electrode ELT2 may be directly disposed on the second partition wall PW2, and the first insulating layer INS1 may overlap at least one area of the second electrode ELT2. The first electrode ELT1 may be disposed on the first insulating layer INS1 to overlap the first partition wall PW1.

In an embodiment, the positions of the first electrode ELT1 and the second electrode ELT2 on layers may be determined taking into account a surface area in which the first and second electrodes ELT1 and ELT2 overlap circuit elements and/or lines disposed thereunder. For example, as illustrated in FIG. 8, in case that the first electrode ELT1 overlaps, by a first surface area, the second power line PL2 (or at least one second circuit element) that is supplied with a signal different from that supplied to the first electrode ELT1, and the second electrode ELT2 overlaps, by a second surface area, the first power line PL1 (or the first circuit element such as at least one transistor T that forms the pixel circuit PXC) that is supplied with a signal different from that supplied to the second electrode ELT2, the positions of the first electrode ELT1 and the second electrode ELT2 on layers may be determined by comparing the size of the first surface area with that of the second surface area.

For instance, if the second surface area is greater than the first surface area, the second electrode ELT2 may be disposed on a layer higher than that of the first electrode ELT1, as illustrated in FIG. 9A. In contrast, if the first surface area is greater than the second surface area, the first electrode ELT1 may be disposed on a layer higher than that of the second electrode ELT2, as illustrated in FIG. 11. In the case where the first surface area is substantially equal to the second surface area, the positions of the first electrode ELT1 and the second electrode ELT2 on layers may be determined depending on a predetermined sequence, process conditions, or the like.

In other words, in an embodiment, an electrode of the first and second electrodes ELT1 and ELT2 that is greater than the other in an overlapping area, in which the electrode overlaps at least one circuit element or line disposed on the circuit element layer PCL disposed thereunder and configured to be supplied with a different type of signal or power, may be disposed at a position farther from the circuit element layer PCL than is the other. Therefore, an interlayer short-circuit defect due to penetration of foreign substances or the like in the processing step may be effectively prevented.

In an embodiment, the positions (or the stacked sequence) of the first contact electrode CNE1 and the second contact electrode CNE2 on the layers may be changed in different embodiments. For example, as illustrated in the embodiment of FIG. 9A, the second contact electrode CNE2 may be formed on the second electrode ELT2, the second contact electrode CNE2 may be overlapped by the second insulating layer INS2, and then the first contact electrode CNE1 may be formed on the second insulating layer INS2. As another example, as illustrated in the embodiment of FIG. 11, the first contact electrode CNE1 may be formed on the first electrode ELT1, and the first contact electrode CNE1 may be overlapped by the second insulating layer INS2, and then the second contact electrode CNE2 may be formed on the second insulating layer INS2. As still another example, in an embodiment, the first and second contact electrodes CNE1 and CNE2 may be simultaneously formed. In other words, in the disclosure, the relative positions between the first contact electrode CNE1 and the second contact electrode CNE2 and/or the formation sequence thereof is not particularly limited and may be changed in various ways.

Figure 12:
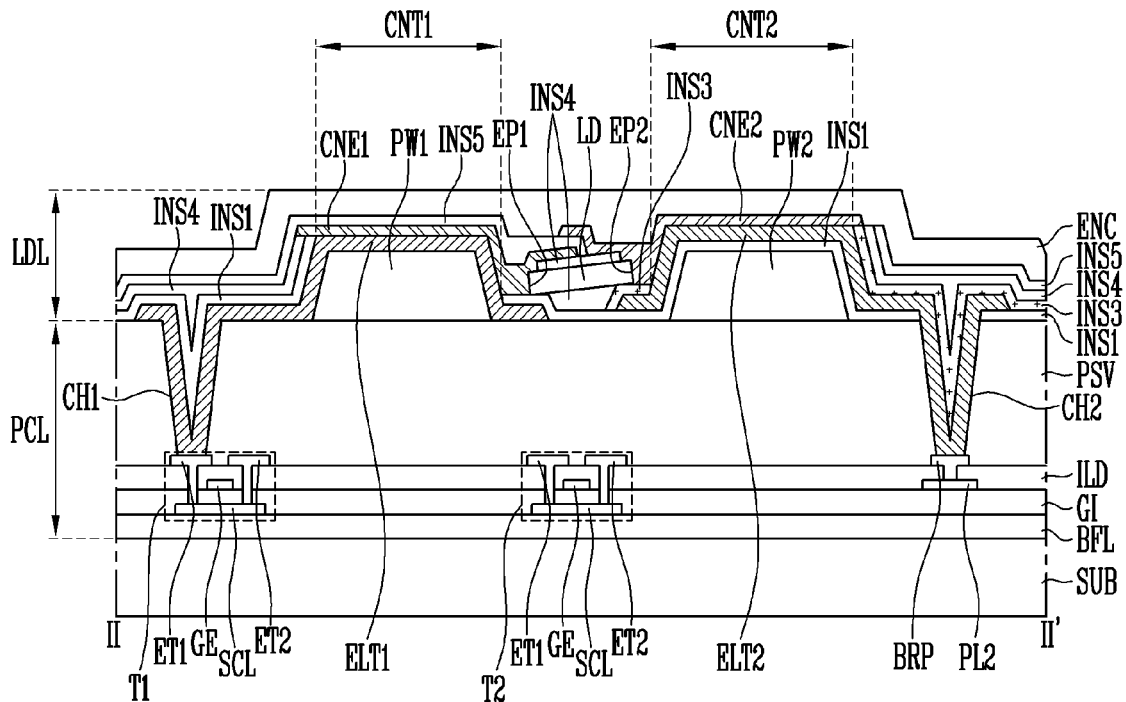
FIG. 12 is a cross-sectional view schematically illustrating a light emitting device in accordance with an embodiment of the disclosure and for example illustrates an embodiment of a cross-section corresponding to line of FIG. 8.

FIG. 12 is a schematic cross-sectional view illustrating a light emitting device in accordance with an embodiment and, for example, illustrates an embodiment of a cross-section corresponding to line II-II' of FIG. 8. In the description of the embodiment of FIG. 12, like reference numerals are used to designate components similar or equal to those of at least one embodiment described above, e.g., the embodiments of FIGS. 9A and 11, and detailed descriptions thereof will be omitted.

Referring to FIGS. 9A, 11, and 12, at least one additional insulating layer may be disposed on any one electrode of the first and second electrodes ELT1 and ELT2 that is disposed at an upper position. For example, in the case where the second electrode ELT2 is disposed on a layer higher than that for the first electrode ELT1, a third insulating layer INS3 may be additionally disposed on the second electrode ELT2.

In an embodiment, the third insulating layer INS3 may include an opening corresponding to the second contact portion CNT2. In other words, the third insulating layer INS3 may be disposed on an area of the second electrode ELT2. For example, the third insulating layer INS3 may be disposed on an area of the second electrode ELT2 other than the second contact portion CNT2. An area of the third insulating layer INS3 may be disposed between the second end EP2 of the light emitting diode LD and an end of the second electrode ELT2 that is adjacent to the second end EP2. The third insulating layer INS3 may protect the second electrode ELT2 during a subsequent process. In an embodiment, the third insulating layer INS3 may prevent or reduce an electric field from being focused on any one electrode of the first electrode ELT1 and the second electrode ELT2.

In an embodiment, after at least one light emitting diode LD is aligned on the substrate SUB and the third insulating layer INS3, at least one insulating layer for stably supporting the light emitting diode LD may be further formed. For example, a fourth insulating layer INS4 may be further formed on the first and second electrodes ELT1 and ELT2 and an area of the light emitting diode LD.

In an embodiment, in the case where the first and second contact electrodes CNE1 and CNE2 are disposed on different layers, at least one insulating layer may be disposed between the first and second contact electrodes CNE1 and CNE2 so that electrical stability can be secured. For example, in the case where the first contact electrode CNE1 is disposed on a layer lower than the second contact electrode CNE2, a fifth insulating layer INS5 may be formed to overlap the first contact electrode CNE1. In an embodiment, an end of the fifth insulating layer INS5 may be interposed between the first contact electrode CNE1 and the second contact electrode CNE2.

FIGS. 13A to 13I are schematic cross-sectional views illustrating a method of fabricating a light emitting device in accordance with an embodiment and, for example, illustrate a method of fabricating the light emitting device in accordance with the embodiment of FIG. 12. In the following description of the method of fabricating the light emitting device in accordance with the embodiment of FIG. 12, detailed descriptions of mechanical and/or methodical configuration similar or identical to those of the fabricating methods of the above-described embodiments, e.g., the fabricating method of the light emitting device of FIG. 9A that has been described with reference to FIGS. 10A to 10K, will be omitted.

Figure 13A:
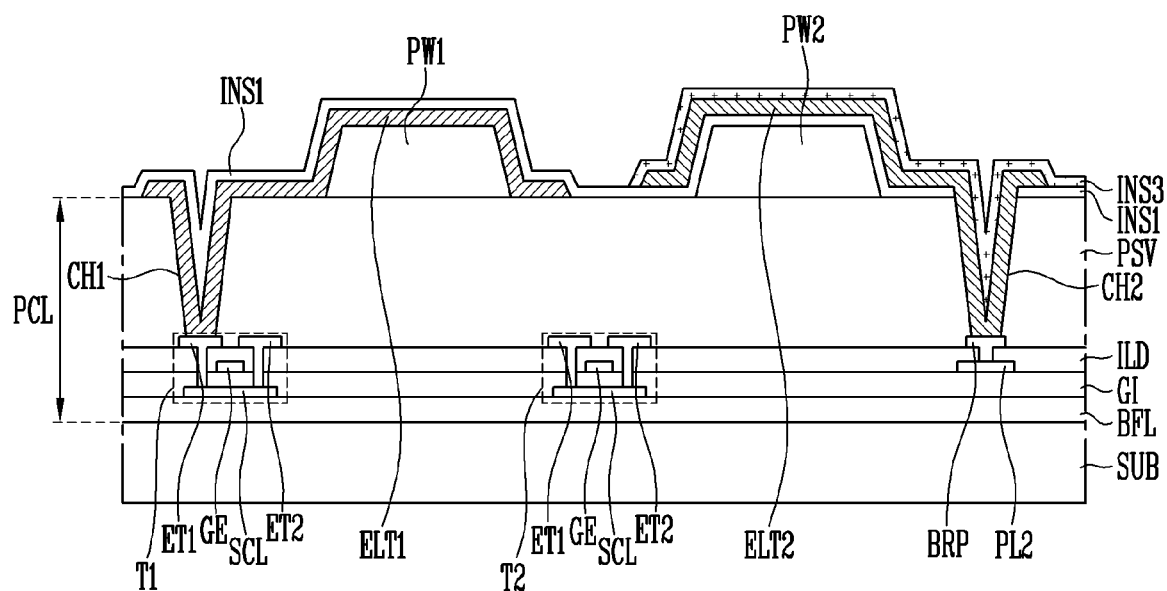
FIGS. 13A to 13I are cross-sectional views schematically illustrating a method of fabricating a light emitting device in accordance with an embodiment of the disclosure and for example illustrate a method of fabricating the light emitting device in accordance with the embodiment of FIG. 12.

Referring to FIG. 13A, the third insulating layer INS3 may be formed on the surface of the substrate SUB on which the first electrode ELT1, the first insulating layer INS1, and the second electrode ELT2 are sequentially formed. In an embodiment, the although the first electrode ELT1, the first insulating layer INS1, the second electrode ELT2, etc. are formed by the fabricating process described with reference to FIGS. 10a to 10e, the disclosure is not limited thereto.

In an embodiment, the third insulating layer INS3 may be formed on the surface of the substrate SUB including the second electrode ELT2 to overlap at least the second electrode ELT2. For example, the third insulating layer INS3 may be formed on the second electrode ELT2 through a photolithography process using a mask or the like.

In an embodiment, the third insulating layer INS3 may be formed by a deposition process of an insulating layer including an inorganic material and/or an organic material and may be formed by various types of known processes. In an embodiment, the third insulating layer INS3 may be formed of a single layer or multiple layers.

Figure 13B:
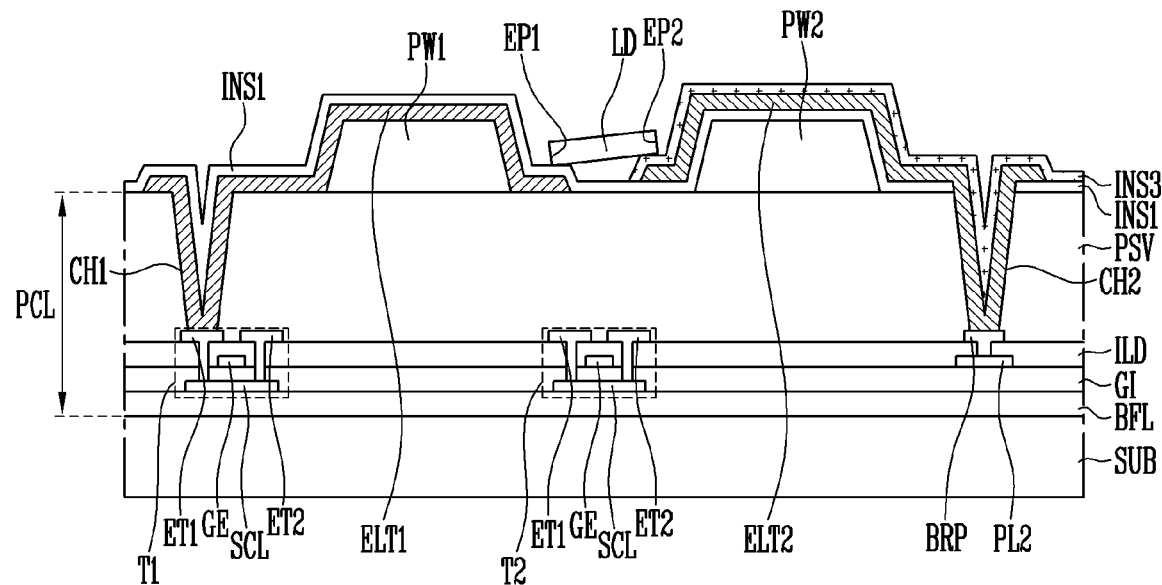

Referring to FIG. 13B, at least one light emitting diode LD may be supplied onto the substrate SUB including the first electrode ELT1 overlapped by the first insulating layer INS1, the second electrode ELT2 overlapped by the third insulating layer INS3, etc., and the light emitting diode LD may be aligned between the first electrode ELT1 and the second electrode ELT2. For example, light emitting diodes LD may be supplied to each pixel area including the first and second electrodes ELT1 and ELT2, and the light emitting diodes LD may be aligned by applying predetermined voltages to the first and second electrodes ELT1 and ELT2.

Figure 13C:
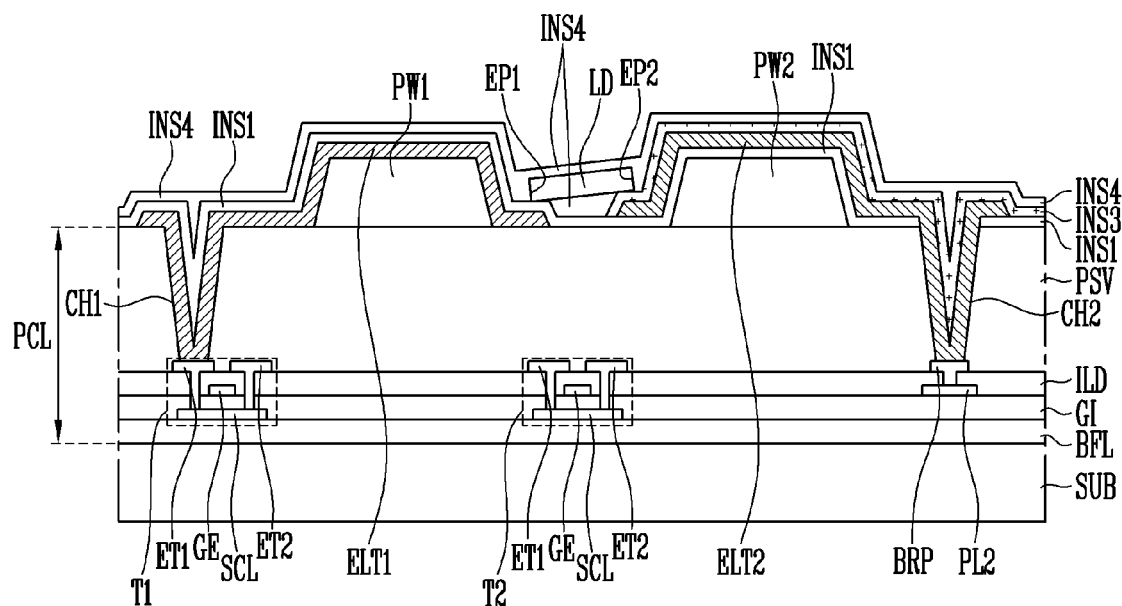

Referring to FIG. 13C, the fourth insulating layer INS4 may be formed on the substrate SUB on which the at least one light emitting diode LD is disposed. In an embodiment, the fourth insulating layer INS4 may be formed in the entire area of each pixel area. In an embodiment, in the case where a space has been present between the first insulating layer INS1 and the light emitting diodes LD in a previous processing step, insulating material for forming the fourth insulating layer INS4 may be formed in the space during a process of forming the fourth insulating layer INS4, so that the space may be filled with the insulating material.

In an embodiment, the fourth insulating layer INS4 may be formed by a deposition process of an insulating layer including an inorganic material and/or organic material and may be formed through various types of known processes. In an embodiment, the fourth insulating layer INS4 may be formed of a single layer or multiple layers.

Figure 13D:
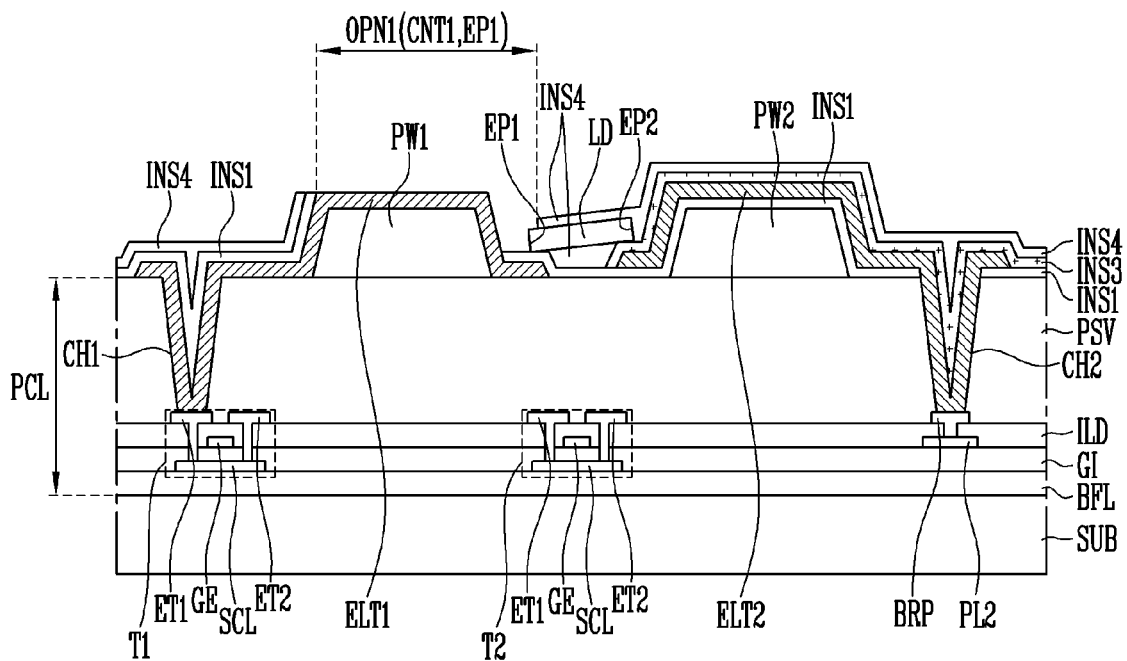

Referring to FIG. 13D, a first opening OPN1 may be formed in the first and fourth insulating layers INS1 and INS4 by etching the first and fourth insulating layers INS1 and INS4 such that an area of the first electrode ELT1 and the first end EP1 of the light emitting diode LD are exposed. The first contact portion CNT1 may be formed on the first electrode ELT1.

Figure 13E:
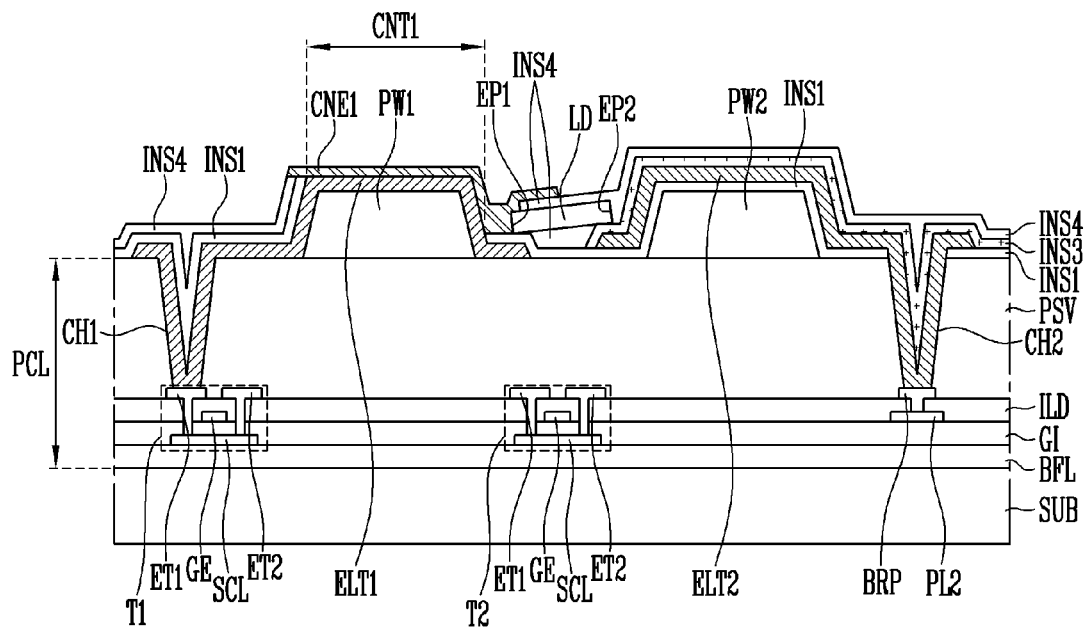

Referring to FIG. 13E, the first contact electrode CNE1 may be formed both on at least one area of the first electrode ELT1 including the first contact portion CNT1 and on the first end EP1 of the light emitting diode LD. The first end EP1 of the light emitting diode LD may be electrically connected to the first electrode ELT1 by the first contact electrode CNE1.

Figure 13F:
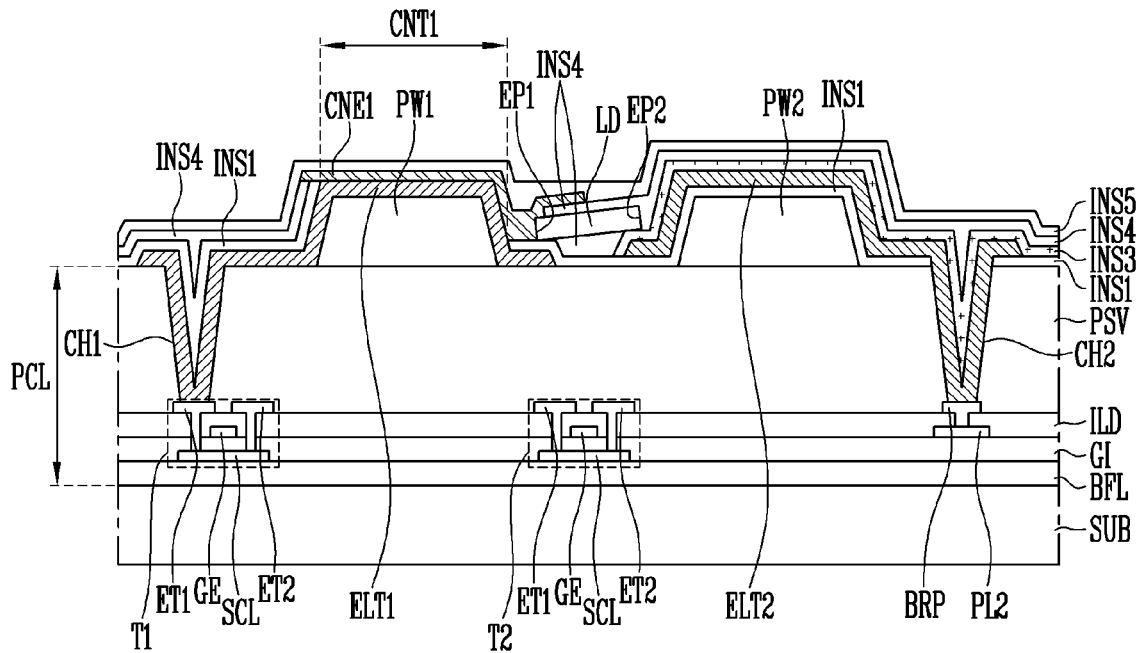

Referring to FIG. 13F, the fifth insulating layer INS5 may be formed on the substrate SUB including the first contact electrode CNE1. In an embodiment, the fifth insulating layer INS5 may be formed to overlap the first contact electrode CNE1. For example, the fifth insulating layer INS5 may be formed on the entire area of each pixel area.

In an embodiment, the fifth insulating layer INS5 may be formed by a deposition process of an insulating layer including an inorganic and/or organic material and may be formed by various types of known processes. The fifth insulating layer INS5 may be formed of a single layer or multiple layers.

Figure 13G:
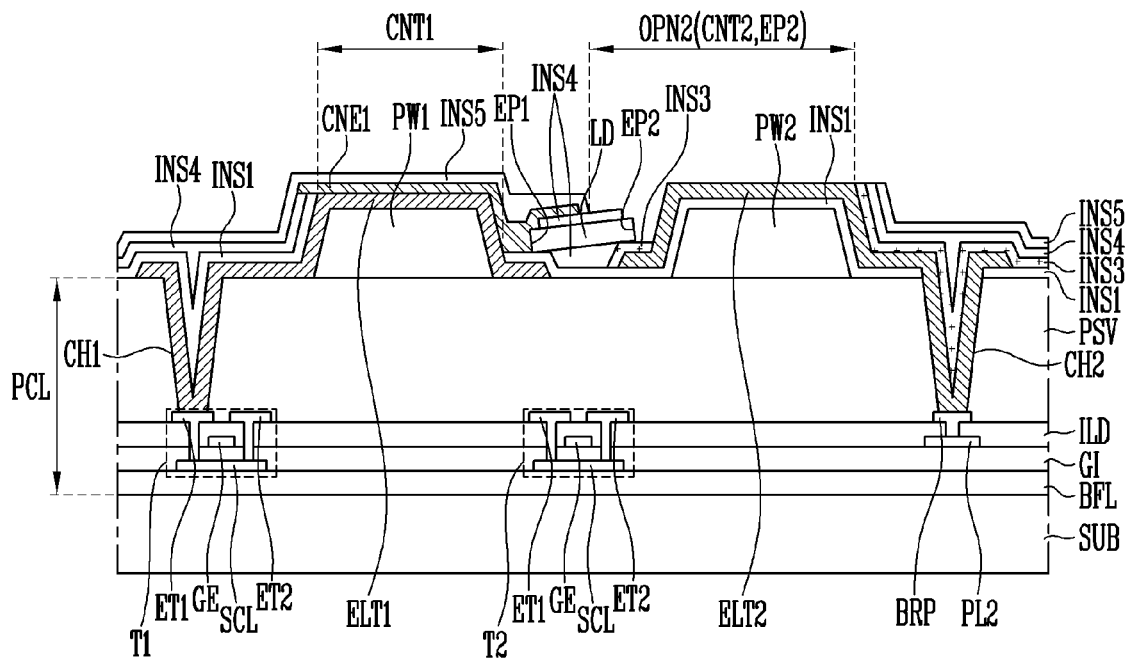

Referring to FIG. 13G, a second opening OPN2 may be formed in the third, fourth, and the fifth insulating layers INS3, INS4, and INS5 by etching the third, fourth, and fifth insulating layers INS3, INS4, and INS5 such that an area of the second electrode ELT2 and the second end EP2 of the light emitting diode LD are exposed. The second contact portion CNT2 may be formed on the second electrode ELT2.

Figure 13H:
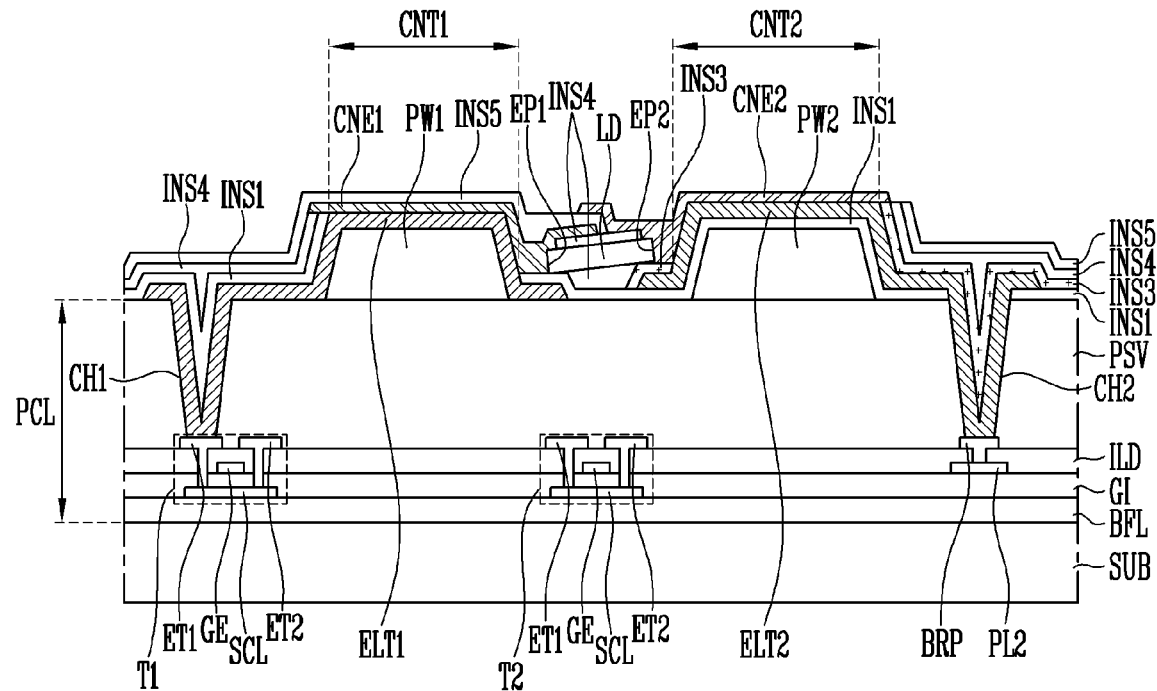

Referring to FIG. 13H, the second contact electrode CNE2 may be formed both on at least one area of the second electrode ELT2 including the second contact portion CNT2 and on the second end EP2 of the light emitting diode LD. The second end EP2 of the light emitting diode LD may be electrically connected to the second electrode ELT2 by the second contact electrode CNE2.

Figure 13I:
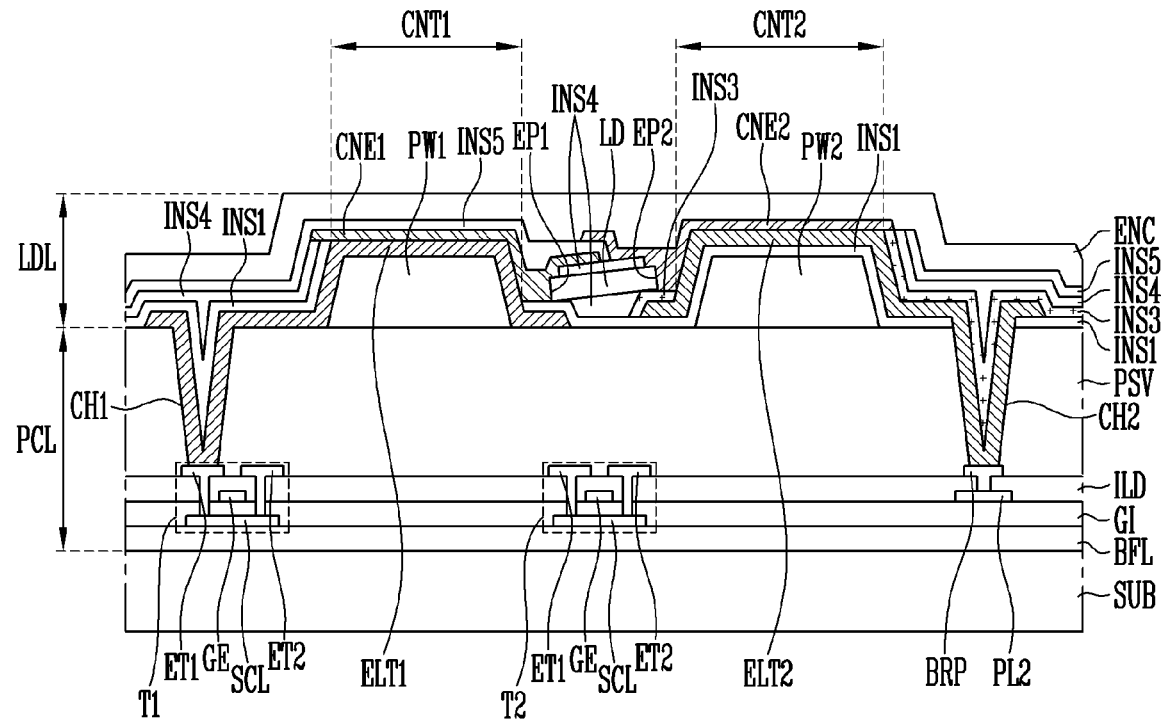

Referring to FIG. 13I, the encapsulation layer ENC (or the overcoat layer or the like) may be formed on the surface of the substrate SUB on which the first and second contact electrodes CNE1 and CNE2 are formed. In this way, the light emitting device (or the pixel PXL) in accordance with the embodiment of FIG. 12 may be fabricated.

Figure 14:
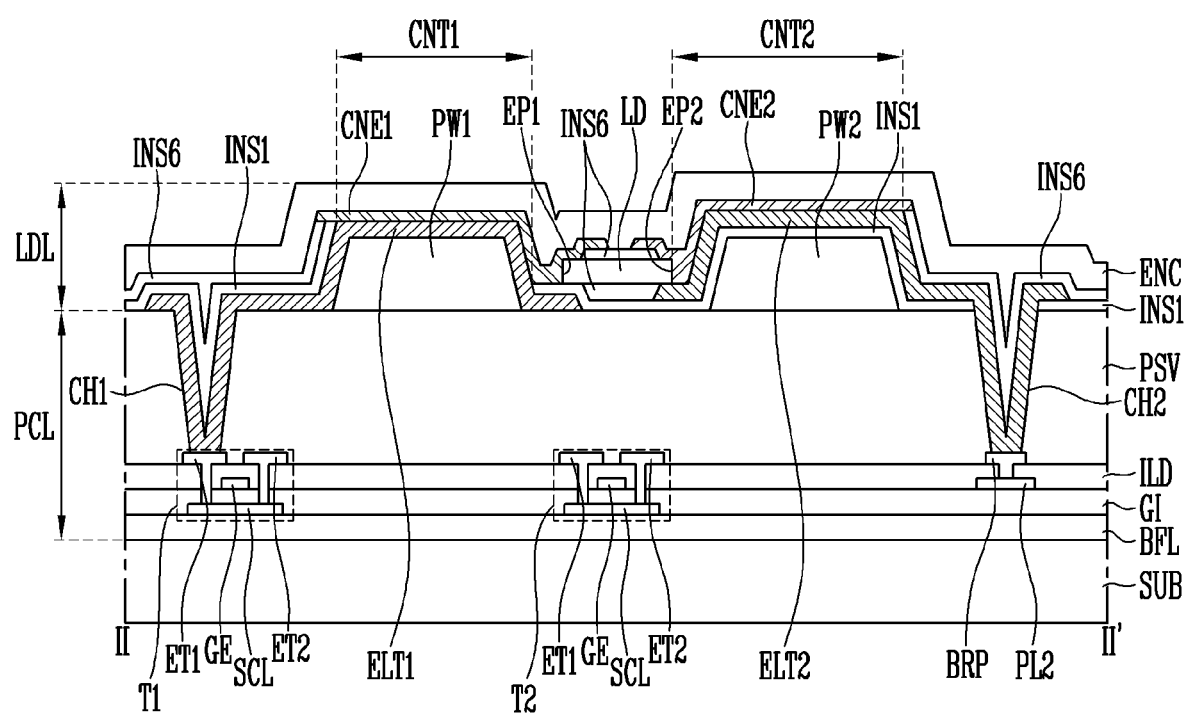
FIG. 14 is a cross-sectional view schematically illustrating a light emitting device in accordance with an embodiment of the disclosure and for example illustrates an embodiment of a cross-section corresponding to line of FIG. 8.

FIG. 14 is a schematic cross-sectional view illustrating a light emitting device in accordance with an embodiment and, for example, illustrates an embodiment of a cross-section corresponding to line II-II' of FIG. 8. FIGS. 15A to 15E are schematic cross-sectional views illustrating a method of fabricating a light emitting device in accordance with an embodiment and, for example, illustrate a method of fabricating the light emitting device in accordance with the embodiment of FIG. 14. In the description of the embodiments of FIGS. 14 to 15E, detailed descriptions of mechanical and/or methodical configuration similar or identical to that of at least one embodiment described above, e.g., the embodiments of FIGS. 9A to 10K, will be omitted Referring to the embodiment of FIGS. 14 to 15E, the first and second contact electrodes CNE1 and CNE2 may be formed simultaneously by the same process. For example, a light emitting device in accordance with an embodiment may include first and second partition walls PW1 and PW2, a first electrode ELT1, a first insulating layer INS1, a second electrode ELT2, at least one light emitting diode LD (e.g., light emitting diodes LD), a sixth insulating layer INS6, first and second contact electrodes CNE1 and CNE2, and an encapsulation layer ENC which are sequentially disposed on a surface of the substrate SUB on which a buffer layer BFL, and/or a circuit element layer PCL, etc. are formed.

In an embodiment, the sixth insulating layer INS6 may be partially disposed on the first electrode ELT1, the second electrode ELT2, and an area of each light emitting diode LD. For example, the sixth insulating layer INS6 may be partially disposed on the first electrode ELT1 and the second electrode ELT2 to respectively expose the first contact portion CNT1 and the second contact portion CNT2. Furthermore, the sixth insulating layer INS6 may be partially disposed on the light emitting diode LD to expose the first end EP1 and the second end EP2 of the light emitting diode LD. In an embodiment, in case that a space is present between the first insulating layer INS1 and the light emitting diodes LD, the space may be filled with the sixth insulating layer INS6 during a process of forming the sixth insulating layer INS6. Therefore, an area of the sixth insulating layer INS6 may also be disposed under the light emitting diode LD. In the case where the first insulating layer INS1 and the sixth insulating layer INS6 are formed of the same material, the first and sixth insulating layers INS1 and INS6 may form an integrated insulating layer rather than being divided into separate insulating layers under the light emitting diodes LD.

In an embodiment, an end of the first contact electrode CNE1 may be disposed on an area of the sixth insulating layer INS6 disposed on the light emitting diode LD. Furthermore, an end of the second contact electrode CNE2 may be disposed on an area of the sixth insulating layer INS6 disposed on the light emitting diode LD and may be disposed to face the first contact electrode CNE1.

Hereinafter, a method of fabricating the light emitting device in accordance with an embodiment of FIG. 14 will be described in more detail with reference to FIGS. 15A to 15E.

Figure 15A:
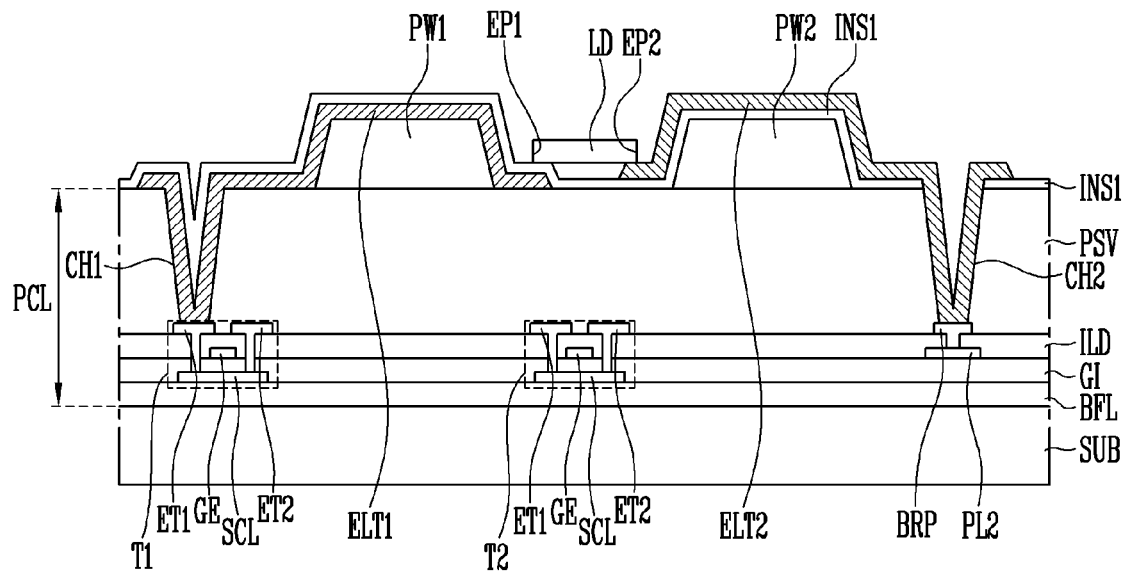
FIGS. 15A to 15E are cross-sectional views schematically illustrating a method of fabricating a light emitting device in accordance with an embodiment of the disclosure and for example illustrate a method of fabricating the light emitting device in accordance with the embodiment of FIG. 14.

Referring to FIG. 15A, at least one light emitting diode LD may be supplied onto the surface of the substrate SUB on which the first electrode ELT1, the first insulating layer INS1, the second electrode ELT2, etc., are sequentially formed, and the light emitting diode LD may be aligned between the first electrode ELT1 and the second electrode ELT2. For example, light emitting diodes LD may be supplied to each pixel area including the first and second electrodes ELT1 and ELT2, and the light emitting diodes LD may be aligned by applying predetermined voltages to the first and second electrodes ELT1 and ELT2.

Figure 15B:
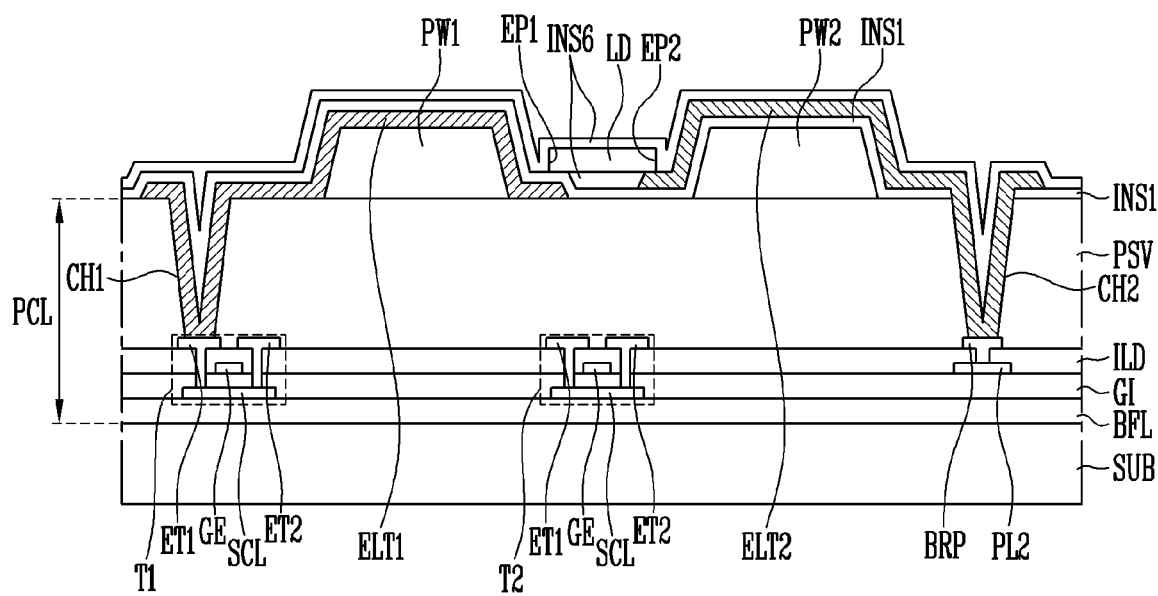

Referring to FIG. 15B, the sixth insulating layer INS6 may be formed on the substrate SUB on which the at least one light emitting diode LD is disposed. In an embodiment, the sixth insulating layer INS6 may be formed in the entire area of each pixel area. In an embodiment, in the case where a space has been present between the first insulating layer INS1 and the light emitting diodes LD in a previous processing step, insulating material for forming the sixth insulating layer INS6 may be drawn into the space during a process of forming the sixth insulating layer INS6, so that the space may be filled with the insulating material.

In an embodiment, the sixth insulating layer INS6 may be formed by a deposition process of an insulating layer including an inorganic material and/or organic material and may be formed by various types of known processes. In an embodiment, the sixth insulating layer INS6 may be formed of a single layer or multiple layers.

Figure 15C:
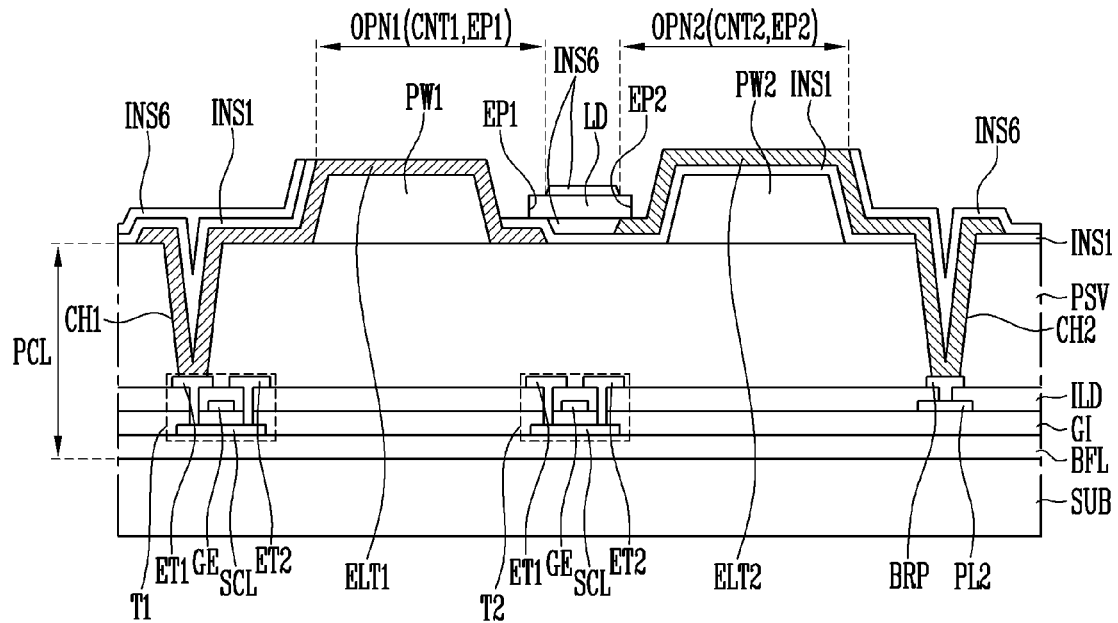

Referring to FIG. 15C, first and second openings OPN1 and OPN2 may be formed in the first and sixth insulating layers INS1 and INS6 by etching the first and sixth insulating layers INS1 and INS6 such that an area of each of the first and second electrodes ELT1 and ELT2 and the first and second ends EP1 and EP2 of the light emitting diode LD are exposed. Therefore, the first contact portion CNT1 may be formed on the first electrode ELT1, and the second contact portion CNT2 may be formed on the second electrode ELT2.

Figure 15D:
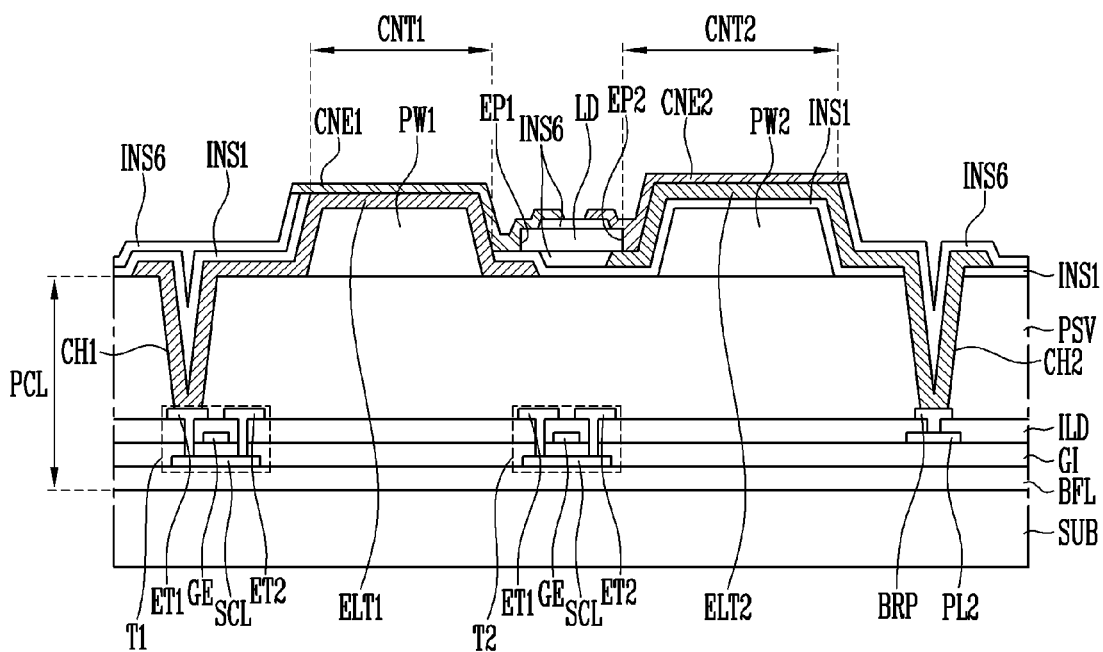

Referring to FIG. 15D, the first contact electrode CNE1 may be formed on at least one area of the first electrode ELT1 including the first contact portion CNT1 and on the first end EP1 of the light emitting diode LD. The second contact electrode CNE2 may be formed on at least one area of the second electrode ELT2 including the second contact portion CNT2 and on the second end EP2 of the light emitting diode LD. In an embodiment, the first and second contact electrodes CNE1 and CNE2 may be simultaneously formed.

Figure 15E:
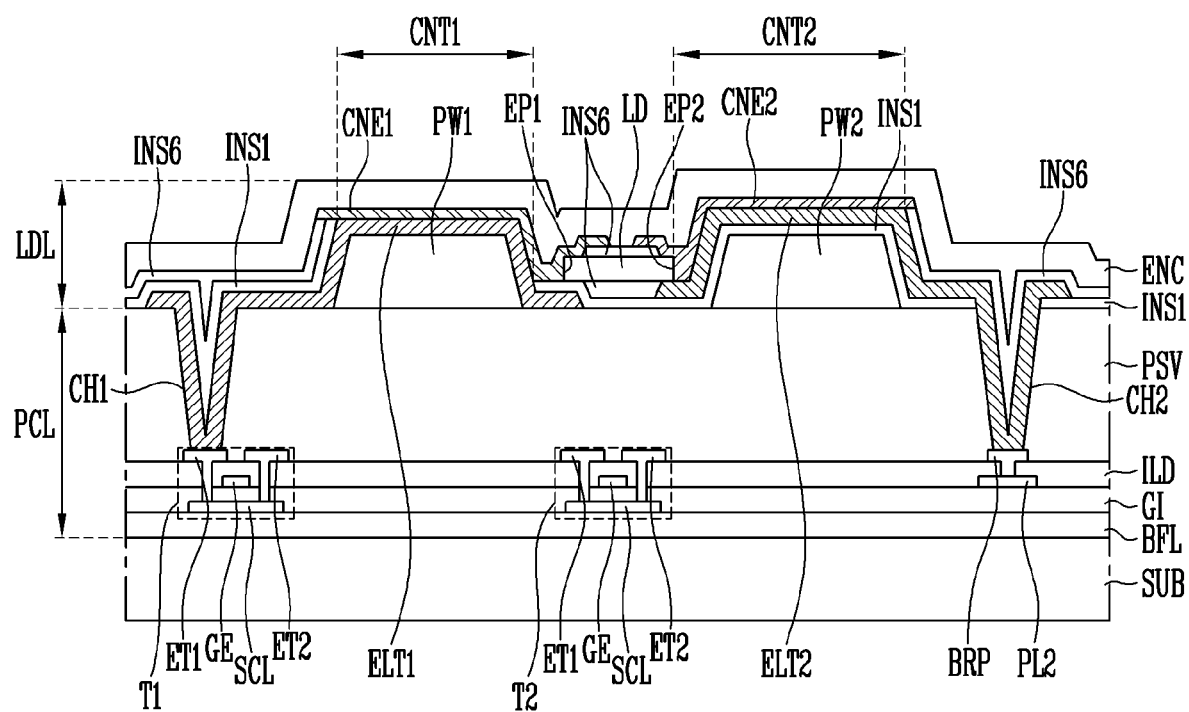

Referring to FIG. 15E, the encapsulation layer ENC (or the overcoat layer or the like) may be formed on the surface of the substrate SUB on which the first and second contact electrodes CNE1 and CNE2 are formed. In this way, the light emitting device (or the pixel PXL) in accordance with the embodiment of FIG. 14 may be fabricated.

In the light emitting device (e.g., the pixel PXL configured of the light emitting device or including the light emitting device), the method of fabricating the light emitting device, and the display device including the light emitting device, the first electrode ELT1 and the second electrode ELT2 may be formed on different layers separated from each other, with the first insulating layer INS1 interposed between the first and second electrodes ELT1 and ELT2. In an embodiment, an electrode of the first and second electrodes ELT1 and ELT2 that is greater than the other in an overlapping area, in which the electrode overlaps at least one circuit element or line disposed thereunder and configured to be supplied with a different type of signal or power, may be disposed on an upper layer.

In embodiments, a short-circuit defect between the first electrode ELT1 and the second electrode ELT2 may be effectively prevented. Furthermore, a process margin between the first electrode ELT1 and the second electrode ELT2 may be reduced, so that the first electrode ELT1 and the second electrode ELT2 may be disposed closer to each other. Therefore, the light emitting diode LD may be more stably arranged between the first electrode ELT1 and the second electrode ELT2.

In the light emitting device according to an embodiment in which the first and second electrodes ELT1 and ELT2 are disposed on the same layer, a short-circuit defect between the first and second electrodes ELT1 and ELT2 may occur by various factors. For example, if the distance between the first and second electrodes ELT1 and ELT2 is not sufficient or penetration of foreign substances is caused in the process of forming the first and second electrodes ELT1 and ELT2 and/or a subsequent process, a short-circuit defect between the first and second electrodes ELT1 and ELT2 may occur.

While the spirit and scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the claimed invention is not limited by detailed descriptions of the specification and should be defined by the accompanying claims. Furthermore, all changes or modifications of the disclosure derived from the meanings and scope of the claims, and equivalents thereof should be construed as being included in the scope of the disclosure.

What is claimed is:
1. A light emitting device comprising:
a first electrode having a first lower surface disposed on a substrate;
a first insulating layer having a second lower surface disposed on the substrate and coplanar with the first lower surface at a first portion of the first insulating layer, the second lower surface overlapping at least a part of the first electrode at a second portion of the first insulating layer;

a second electrode disposed on the first insulating layer and spaced apart from the first electrode; and at least one light emitting diode disposed on the first insulating layer and electrically connected between the first electrode and the second electrode, wherein the first electrode and the second electrode are disposed on different layers on the substrate, the first insulating layer is disposed between the first electrode and the second electrode, the first electrode and the second electrode are spaced apart from each other so as not to overlap each other in a plan view, the light emitting device further comprises a display element layer including the first electrode, the second electrode, and the least one light emitting diode, and a circuit element layer disposed between the display element layer and the substrate, and the circuit element layer comprises: a first circuit element or a first power line electrically connected to the first electrode and including a part overlapping the second electrode; and a second circuit element or a second power line electrically connected to the second electrode and including a part overlapping the first electrode.

2. The light emitting device according to claim 1, further comprising:
a first partition wall disposed between the substrate and the first electrode; and
a second partition wall disposed between the substrate and the second electrode.

3. The light emitting device according to claim 2, wherein the first partition wall and the second partition wall are disposed on a same layer on the substrate, and
a part of the first insulating layer is disposed between the second partition wall and the second electrode.

4. The light emitting device according to claim 1, wherein an overlapping surface area between the first circuit element or the first power line and the second electrode is greater than an overlapping surface area between the second circuit element or the second power line and the first electrode.

5. The light emitting device according to claim 1, further comprising:
a first contact electrode disposed on at least a part of the first electrode and a first end of the at least one light emitting diode, and electrically connecting the first end of the at least one light emitting diode to the first electrode; and
a second contact electrode disposed on at least a part of the second electrode and a second end of the at least one light emitting diode, and electrically connecting the second end of the at least one light emitting diode to the second electrode.

6. The light emitting device according to claim 5, wherein the first insulating layer includes an opening in which a part of the first electrode is exposed, and
the first contact electrode electrically contacts the exposed part of the first electrode and the first end of the at least one light emitting diode.

7. The light emitting device according to claim 5, further comprising a second insulating layer disposed on the second contact electrode and overlapping the second contact electrode, wherein an end of the second insulating layer is disposed between the first contact electrode and the second contact electrode.

8. The light emitting device according to claim 5, further comprising a third insulating layer disposed on a part of the second electrode.

9. The light emitting device according to claim 5, further comprising at least one of:
a fourth insulating layer disposed on the first electrode, the second electrode, and a part of the at least one light emitting diode; and
a fifth insulating layer overlapping the first contact electrode, the fifth insulating layer including an end disposed between the first contact electrode and the second contact electrode.

10. The light emitting device according to claim 5, further comprising a sixth insulating layer disposed on a part of the first electrode, a part of the second electrode, and a part of the at least one light emitting diode, and exposing a part of the first electrode, a part of the second electrode, and the first end and the second end of the at least one light emitting diode.

11. The light emitting device according to claim 10, wherein
an end of the first contact electrode is disposed on a part of the sixth insulating layer that is disposed on the at least one light emitting diode, and
an end of the second contact electrode is disposed on a part of the sixth insulating layer that is disposed on the at least one light emitting diode and faces the first contact electrode.

12. The light emitting device according to claim 5, further comprising at least one encapsulation layer overlapping a surface of the substrate on which the first contact electrode and the second contact electrode are disposed.

13. The light emitting device according to claim 1, wherein the at least one light emitting diode comprises a rod-type light emitting diode oriented in a horizontal direction between the first electrode and the second electrode.

14. The light emitting device of claim 1, wherein the first portion and the second portion of the first insulating layer are adjacent and directly contact each other.

15. The light emitting device of claim 1, wherein
the second lower surface at a third portion of the first insulating layer is coplanar with the first lower surface of the first electrode;
the second electrode is disposed on the first insulating layer at the third portion.

16. The light emitting device of claim 1, wherein the second electrode in its entirety overlaps the first insulating layer.

17. The light emitting device of claim 1, wherein the at least one light emitting diode is disposed directly on an upper surface of the first insulating layer and directly on an upper surface of the second electrode.

18. A display device comprising:
a substrate including a display area; and
a pixel disposed in the display area,
wherein the pixel comprises:
a first electrode having a first lower surface disposed on the substrate;
a first insulating layer having a second lower surface disposed on the substrate and coplanar with the first lower surface at a first portion of the first insulating layer, the second lower surface overlapping at least a part of the first electrode at a second portion of the first insulating layer;

a second electrode disposed on the first insulating layer and spaced apart from the first electrode in a plan view; and at least one light emitting diode disposed on the first insulating layer and electrically connected between the first electrode and the second electrode, a first contact electrode disposed on at least a part of the first electrode and a first end of the at least one light emitting diode, and electrically connecting the first end of the at least one light emitting diode to the first electrode; and a second contact electrode disposed on at least a part of the second electrode and a second end of the at least one light emitting diode, and electrically connecting the second end of the at least one light emitting diode to the second electrode.

* * * * *